United States Patent
Linnen et al.

(10) Patent No.: US 10,776,277 B2
(45) Date of Patent: Sep. 15, 2020

(54) PARTIAL MEMORY DIE WITH INTER-PLANE RE-MAPPING

(71) Applicant: SANDISK TECHNOLOGIES LLC, Plano, TX (US)

(72) Inventors: Daniel Linnen, Naperville, IL (US); Srikar Peesari, San Jose, CA (US); Kirubakaran Periyannan, Santa Clara, CA (US); Avinash Rajagiri, San Jose, CA (US); Shantanu Gupta, Milpitas, CA (US); Jagdish Sabde, Fremont, CA (US); Ashish Ghai, San Jose, CA (US); Deepak Bharadwaj, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 24 days.

(21) Appl. No.: 15/799,643

(22) Filed: Oct. 31, 2017

(65) Prior Publication Data
US 2019/0129861 A1    May 2, 2019

(51) Int. Cl.
*G06F 12/10* (2016.01)
*G06F 3/06* (2006.01)
(Continued)

(52) U.S. Cl.
CPC ............ *G06F 12/10* (2013.01); *G06F 3/0604* (2013.01); *G06F 3/064* (2013.01); *G06F 3/0656* (2013.01);
(Continued)

(58) Field of Classification Search
CPC ..... G06F 13/10; G06F 11/2094; G11C 16/10; G11C 11/34
(Continued)

(56) References Cited

U.S. PATENT DOCUMENTS 4,398,248 A * 8/1983 Hsia .................. G11C 29/765
                                                    365/200
4,758,863 A   7/1988 Nikkel
(Continued)

OTHER PUBLICATIONS

Agrawal, et al., "Design Tradeoffs for SSD Performance," ATC'08 USENIX 2008 Annual Technical Conference pp. 57-70, Boston, Massachusetts—Jun. 22-27, 2008.
(Continued)

*Primary Examiner* — William B Partridge
*Assistant Examiner* — John Francis Wojton
(74) *Attorney, Agent, or Firm* — Vierra Magen Marcus LLP

(57) ABSTRACT

A partial memory die comprises a memory structure that includes a first plane of non-volatile memory cells and a second plane of non-volatile memory cells. The second plane of non-volatile memory cells is incomplete. A first buffer is connected to the first plane. A second buffer is connected to the second plane. A data path circuit is connected to an input interface, the first buffer and the second buffer. The data path circuit is configured to map data received at the input interface and route the mapped data to either the first buffer or the second buffer. An inter-plane re-mapping circuit is connected to the first buffer and the second buffer, and is configured to re-map data from the first buffer and store the re-mapped data in the second buffer for programming into the second plane.

18 Claims, 19 Drawing Sheets

(51) Int. Cl.
| | |
|---|---|
| *G11C 16/04* | (2006.01) |
| *G11C 13/00* | (2006.01) |
| *G11C 11/16* | (2006.01) |
| *G11C 16/08* | (2006.01) |
| *G11C 5/02* | (2006.01) |
| *G11C 16/10* | (2006.01) |
| *G11C 8/06* | (2006.01) |
| *G11C 7/10* | (2006.01) |

(52) U.S. Cl.
CPC ............ *G06F 3/0679* (2013.01); *G11C 5/02* (2013.01); *G11C 8/06* (2013.01); *G11C 11/16* (2013.01); *G11C 11/1653* (2013.01); *G11C 11/1675* (2013.01); *G11C 13/0004* (2013.01); *G11C 13/0023* (2013.01); *G11C 13/0069* (2013.01); *G11C 16/0408* (2013.01); *G11C 16/0483* (2013.01); *G11C 16/08* (2013.01); *G11C 16/10* (2013.01); *G06F 2212/1044* (2013.01); *G06F 2212/2022* (2013.01); *G06F 2212/657* (2013.01); *G11C 7/1039* (2013.01); *G11C 2207/107* (2013.01)

(58) Field of Classification Search
USPC .......................................... 711/202; 395/425
See application file for complete search history.

(56) References Cited

U.S. PATENT DOCUMENTS

| | | | | |
|---|---|---|---|---|
| 5,256,578 | A * | 10/1993 | Corley | H01L 23/544 257/E23.179 |
| 5,302,477 | A | 4/1994 | Dao | |
| 5,359,713 | A * | 10/1994 | Moran | G06F 13/102 706/925 |
| 5,362,583 | A | 11/1994 | Nakagawa | |
| 5,966,315 | A | 10/1999 | Muller | |
| 6,393,543 | B1 * | 5/2002 | Vilkov | G06F 12/0207 211/200 |
| 6,557,162 | B1 | 4/2003 | Pierrat | |
| 6,844,118 | B2 | 1/2005 | Stanton | |
| 6,927,145 | B1 | 8/2005 | Yang | |
| 7,689,966 | B2 | 3/2010 | Verma | |
| 7,901,850 | B2 | 3/2011 | Fujimura | |
| 7,925,486 | B2 | 4/2011 | Smith | |
| 7,952,184 | B2 * | 5/2011 | Farrar | H01L 23/3121 257/687 |
| 7,962,863 | B2 | 6/2011 | Su | |
| 8,151,220 | B2 | 4/2012 | Hess | |
| 9,548,130 | B2 | 1/2017 | Dutta | |
| 9,583,220 | B2 | 2/2017 | Tsai | |
| 10,019,332 | B1 * | 7/2018 | Sehgal | G11C 16/10 |
| 10,290,354 | B1 * | 5/2019 | Linnen | G11C 7/106 |
| 2002/0180947 | A1 | 12/2002 | Pierrat | |
| 2005/0140952 | A1 | 6/2005 | Park | |
| 2008/0056026 | A1 | 3/2008 | Lee | |
| 2008/0162781 | A1 | 7/2008 | Haller | |
| 2011/0060888 | A1 | 3/2011 | Keeth | |
| 2014/0063888 | A1 | 3/2014 | Lee | |
| 2014/0164679 | A1 | 6/2014 | Manohar | |

OTHER PUBLICATIONS

Tripathi, et al., "Methodologies for Supplier Partnership and Manufacturing Implementation of Continuous Improvement Projects," Advanced Semiconductor Manufacturing Conference and Workshop, 1994 IEEE/Semi, Nov. 14-16, 1994.

* cited by examiner

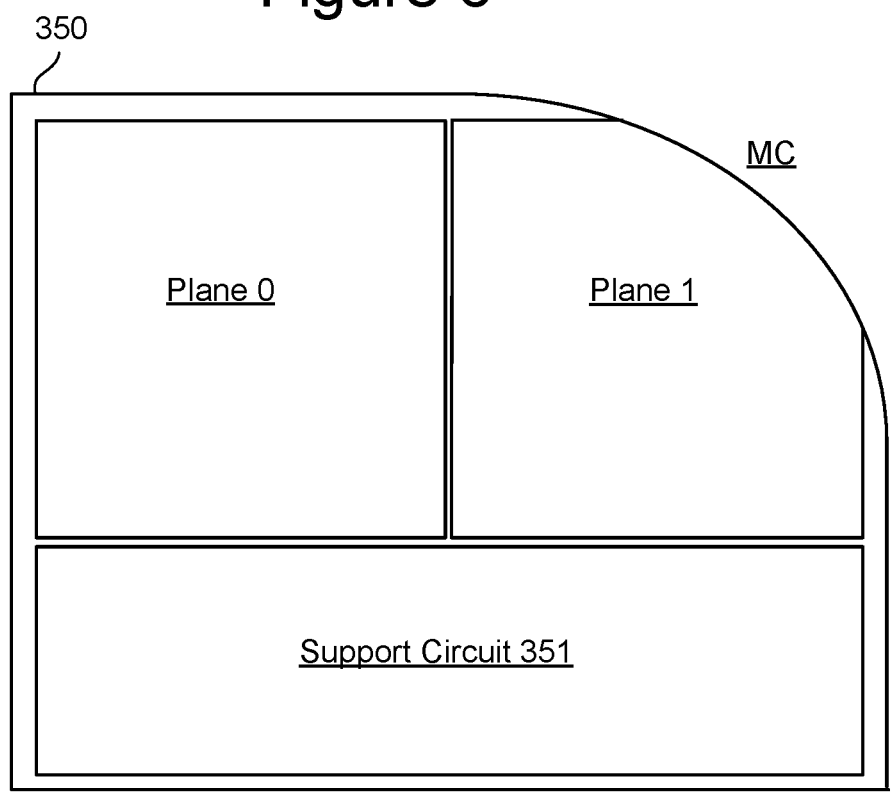

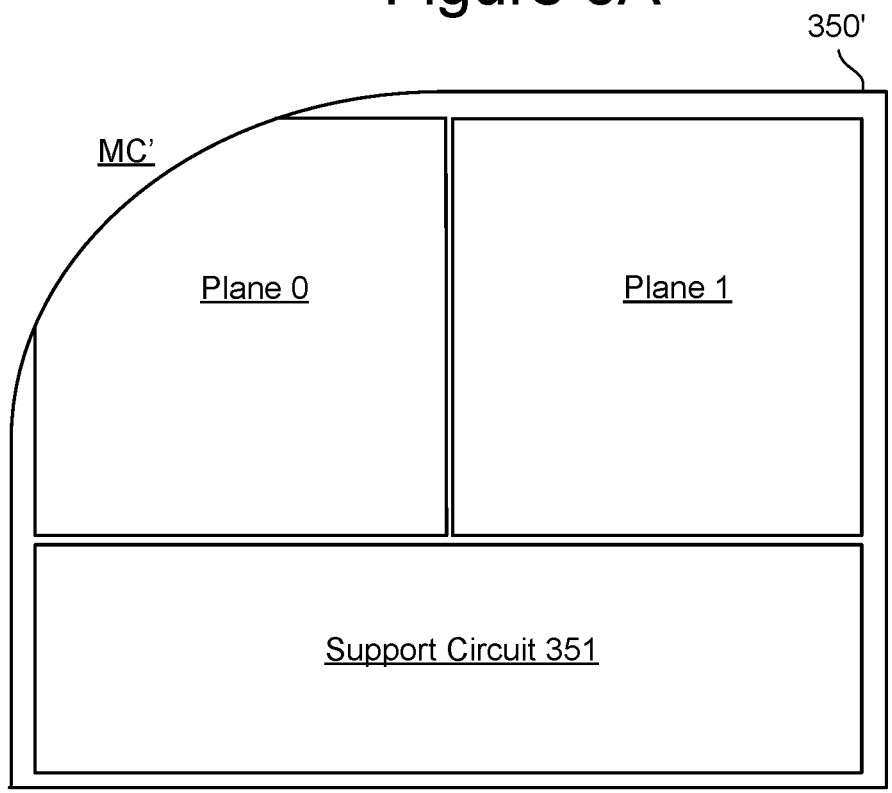

Figure 9
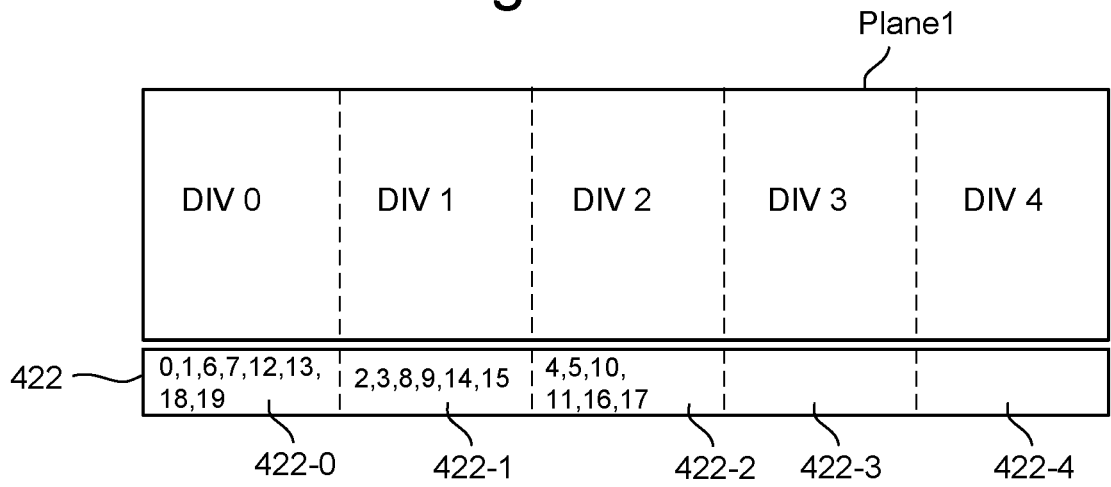
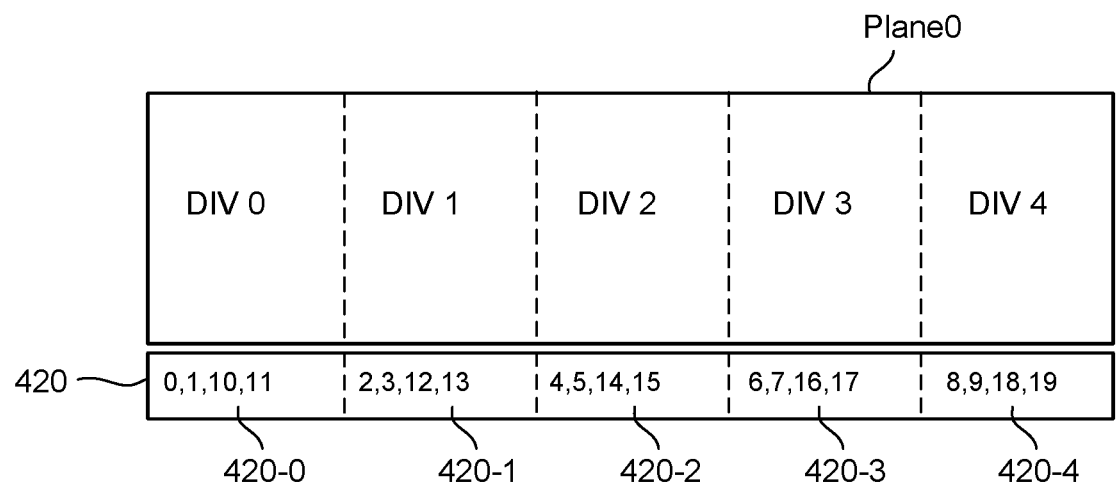
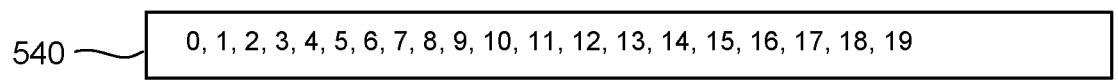

PARTIAL MEMORY DIE WITH INTER-PLANE RE-MAPPING

BACKGROUND

Semiconductor memories, such as flash memory and other types of memories, are often manufactured on a semiconductor wafer (or other material). Reticles are used to print circuits (or images of circuits) on the wafer. The reticle is moved across a wafer for a plurality of shots. Because the memory die is rectangular and the wafer is round, there will be dies printed at the edges for which a portion of the die is off the edge of the wafer, thereby making the die incomplete (and referred to as a partial memory die). For example, FIG. 1 depicts a wafer 10. A plurality of instances of a memory system are fabricated on wafer 10. Each instance of the memory system will become a memory die. Eventually, wafer 10 will be cut into separate dies in a process referred to as singulation. FIG. 1 shows dies A, B, C, D, E, F and G of wafer 10. It is likely that wafer 10 will include other dies in addition to A-G; however, those other dies are not depicted to make FIG. 1 easier to read. As can been seen, dies A-F are formed within the boundary of wafer 10. However, die G is fabricated at the edge of wafer 10 such that a portion of what should have been die G is off the edge of wafer 10 and, therefore, missing from die G. As a result, die G is a partial memory die.

In the past, partial memory dies were discarded because they were missing components and, therefore, did not function properly.

BRIEF DESCRIPTION OF THE DRAWINGS

Like-numbered elements refer to common components in the different figures.

FIG. 6 depicts a partial memory die.
FIG. 6A depicts a partial memory die.
FIG. 9 depicts one example of how data is mapped and then re-mapped.

DETAILED DESCRIPTION

It is proposed to utilize partial memory die that are configured to successfully perform programming, erasing and reading. Using partial die will increase manufacturing yield and reduce waste. Therefore, more memory die from a wafer can be sold, which increases the revenue derived from a manufactured semiconductor wafer.

Figure 1:
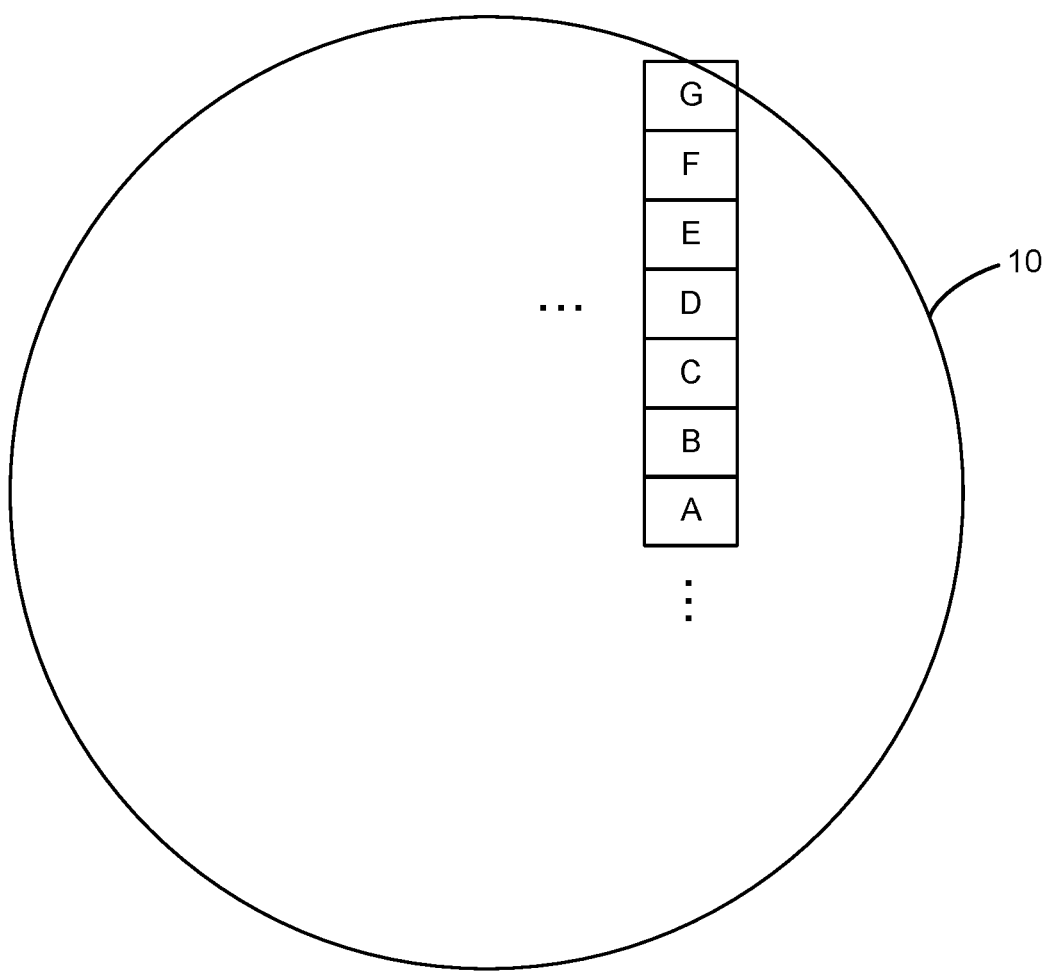
FIG. 1 depicts a wafer.

As used herein, a partial memory die may include a non-volatile memory structure that is missing components due to a portion of that memory structure not being printed (or otherwise fabricated). There may be a variety of reasons that the portion of the memory structure is not printed or otherwise fabricated. In certain embodiments, the portion of the memory structure is not printed or otherwise fabricated because the die positioning on the wafer results in some portion of the die being positioned on the wafer and another portion of the die being positioned beyond the edge of the wafer, as discussed above with respect to die G of FIG. 1. In some embodiments, the partial memory die also includes a support circuit connected to the memory structure. The support circuit is configured to store data (also referred to as program data in certain embodiments) to the memory structure and read data from the memory structure, even if the memory structure is missing components.

One embodiment of a partial memory die configured to successfully perform programming, erasing (or resetting or switching of stored values) and reading comprises a memory structure that includes a first plane of non-volatile memory cells and a second plane of non-volatile memory cells. The second plane of non-volatile memory cells is incomplete because it is missing components due to a portion of the second plane not being printed (or otherwise not fabricated) because the die was at the edge of the wafer, as discussed above with respect to die G of FIG. 1. A first buffer is connected to the first plane. A second buffer is connected to the second plane. An inter-plane re-mapping circuit is connected to the first buffer and the second buffer. The inter-plane re-mapping circuit is configured to re-map the data from the first buffer and store the re-mapped data in the second buffer for programming into the second plane in a manner that attempts to store data in components that exists in the second plane and not store data in components that do not exist in the second plane. For example, the inter-plane re-mapping circuit re-maps the data (e.g., user data or host data) from the first register to align the re-mapped data with complete portions of the second plane and not align the re-mapped data with an incomplete portion of the second plane. More details are provided below.

Figure 2:
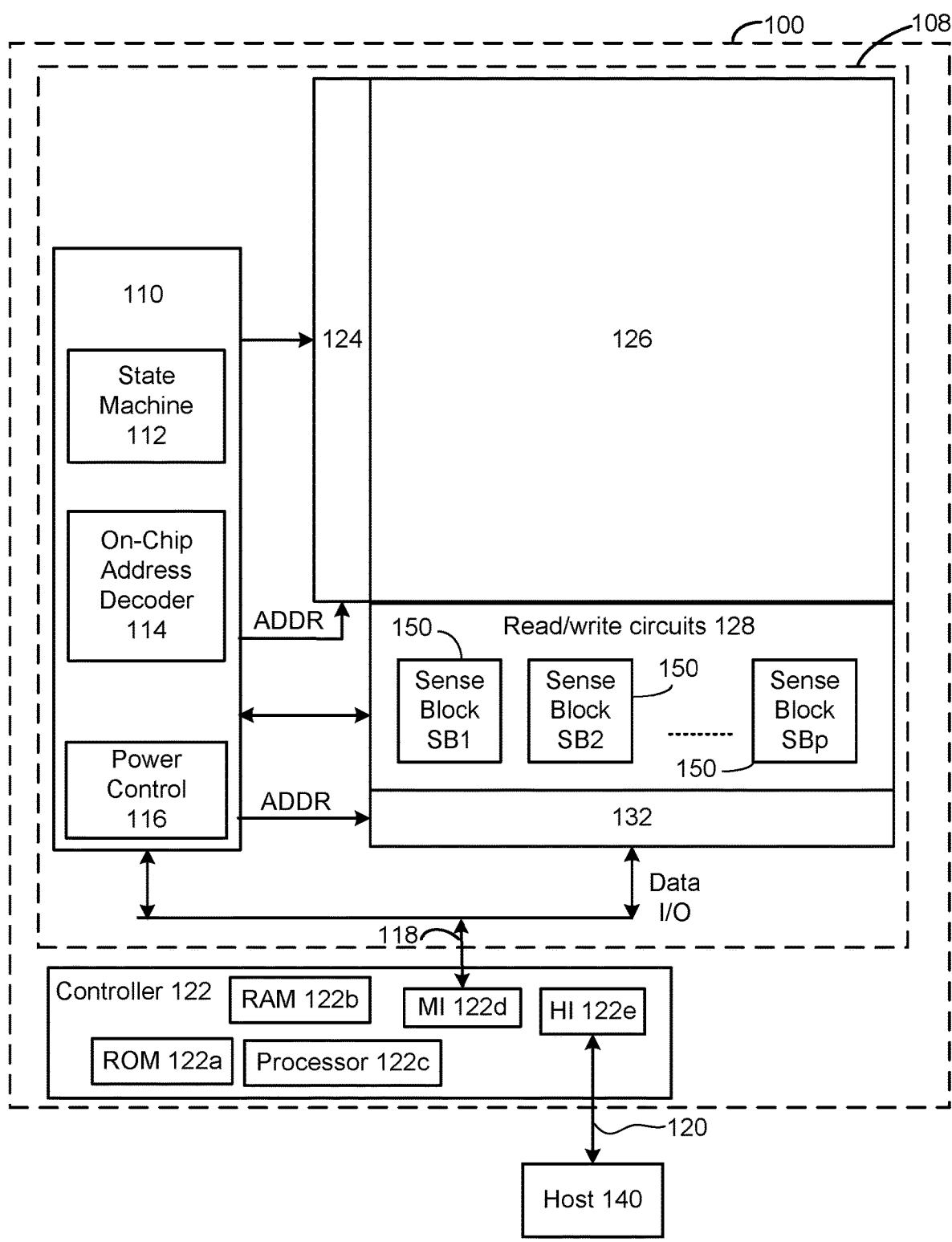
FIG. 2 is a block diagram of a memory system.

FIG. 2 is a functional block diagram of an example memory system 100. The components depicted in FIG. 2 are electrical circuits. Memory system 100 includes one or more memory dies 108. The one or more memory dies 108 can be complete memory die or partial memory die. If any of the memory dies 108 are partial memory dies, these can be successfully programmed (e.g., written to), erased and read using the technology described herein. In one embodiment, each memory die 108 includes a memory structure 126, control circuitry 110, and read/write circuits 128. Memory structure 126 is addressable by word lines via a row decoder 124 and by bit lines via a column decoder 132. The read/write circuits 128 include multiple sense blocks 150 including SB1, SB2, ..., SBp (sensing circuitry) and allow a page of memory cells to be read or programmed in parallel. In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides die-level control of memory operations. In one embodiment, state machine 112 is programmable by software. In other embodiments, state machine 112 does not use software and is completely implemented in hardware (e.g., electrical circuits). In one embodiment, control circuitry 110 includes buffers such as registers, ROM fuses and other storage devices for storing default values such as base voltages and other parameters (e.g. see FIG. 7B).

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers.

State machine 112 and/or controller 122, as well as equivalently functioned circuits, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122c, ROM 122a, RAM 122b, a memory interface 122d and a host interface 122e, all of which are interconnected. The one or more processors 122c is one example of a control circuit. Other embodiments can use state machines or other custom circuits designed to perform one or more functions. The storage devices (ROM 122a, RAM 122b) stored code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
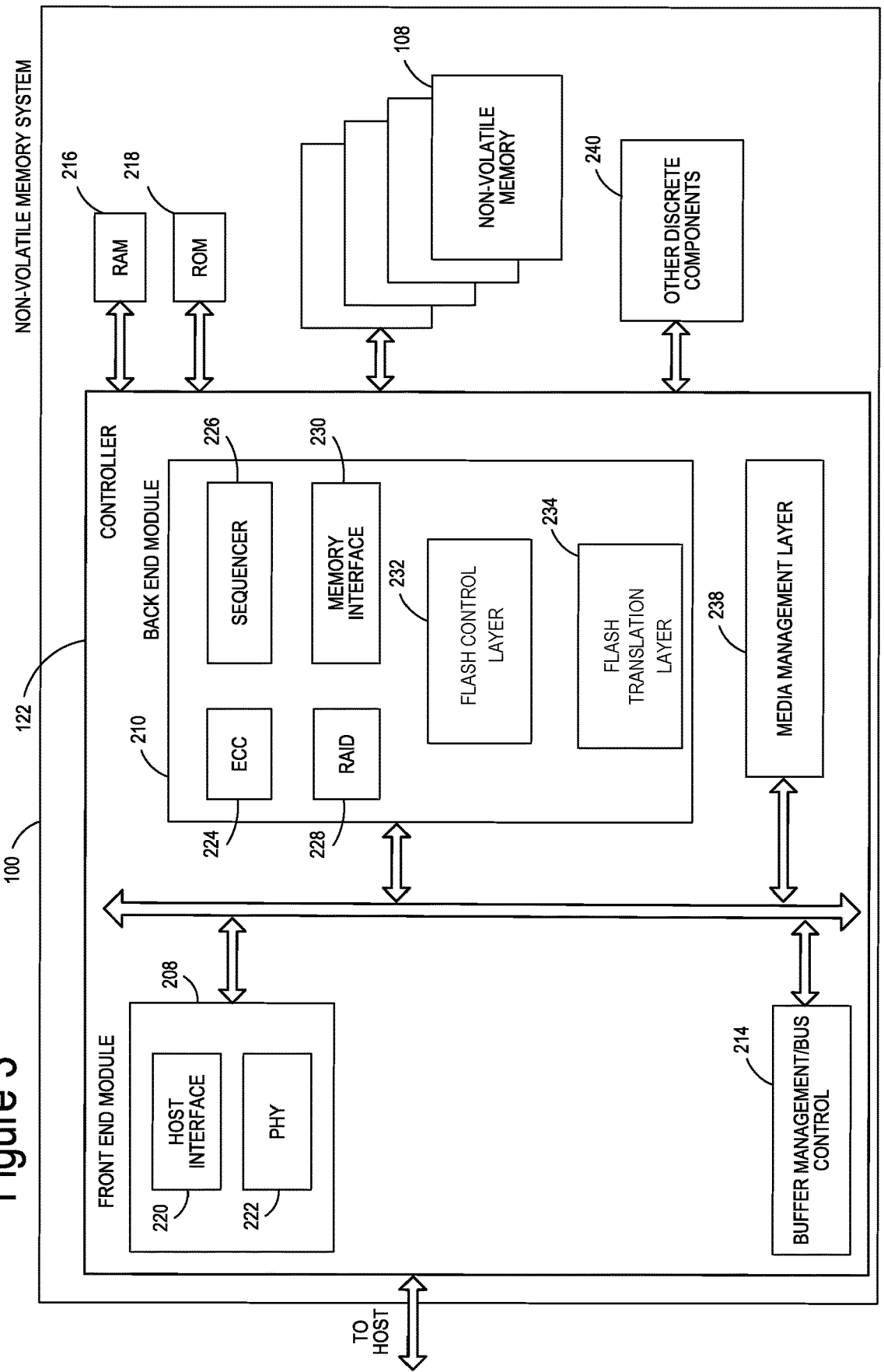
FIG. 3 is a block diagram of a memory system.

FIG. 3 is a block diagram of example memory system 100, depicting more details of one example implementation of controller 122 that can successfully program an incomplete memory storage unit of a partial memory die. As used herein, a flash memory controller is a device that manages data stored on flash memory and communicates with a host, such as a computer or electronic device. A flash memory controller can have various functionality in addition to the specific functionality described herein. For example, the flash memory controller can manage the read and programming processes, format the flash memory to ensure the memory is operating properly, map out bad flash memory cells, and allocate spare memory cells to be substituted for future failed cells. Some part of the spare memory cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific memory storage units of memory that would otherwise be repeatedly written to) and garbage collection (after a memory storage unit is full, moving only the valid pages of data to a new memory storage unit, so the full memory storage unit can be erased and reused).

The interface between controller 122 and non-volatile memory die 108 may be any suitable memory interface, such as Toggle Mode 200, 400, or 800. In one embodiment, memory system 100 may be a card based system, such as a secure digital (SD) or a micro secure digital (micro-SD) card that can be in or connected to cellular telephones, computers, servers, smart appliances, digital cameras, etc. In an alternate embodiment, memory system 100 may be part of an embedded memory system. In another example, the memory system may be in the form of a solid state disk (SSD) drive (having one or, more memory die 108) installed in or connected to a personal computer or server. Examples of hosts are cellular telephones, computers, servers, smart appliances, digital cameras, etc.

In some embodiments, non-volatile memory system 100 includes a single channel between controller 122 and non-volatile memory die 108, however, the subject matter described herein is not limited to having a single memory channel. For example, in some memory system architectures, 2, 4, 8 or more channels may exist between the controller and a memory die, depending on controller capabilities. In any of the embodiments described herein, more than a single channel may exist between the controller and the memory die, even if a single channel is shown in the drawings.

As depicted in FIG. 3, controller 126 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function or related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor or circuit for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, controller 122, RAM 216, and ROM 218 may be located on separate semiconductor die. In some embodiments, a portion of RAM 216 is used to cache program data.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 (electrical circuit, software or combination of circuit and software) that encodes the data bytes received from the host, and decodes and error corrects the data bytes read from the non-volatile memory. A command sequencer 226 generates command sequences, such as program/read/erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra memory erase block, or extra word lines within a memory erase block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface.

A flash control layer 232 (firmware and/or hardware, such as an electrical circuit) controls the overall operation of back end module 210. Flash control layer 232 includes a program manager that manages the programming processes described below. The program manager can be implemented as a dedicated electrical circuit or via software (e.g., firmware).

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122. Flash translation layer 234 manages the translation between logical addresses and physical addresses. Logical addresses are used to communicate with the host. Physical addresses are used to communicate with the memory die. Flash translation layer 234 can be a dedicated electrical circuit or firmware.

Figure 4:
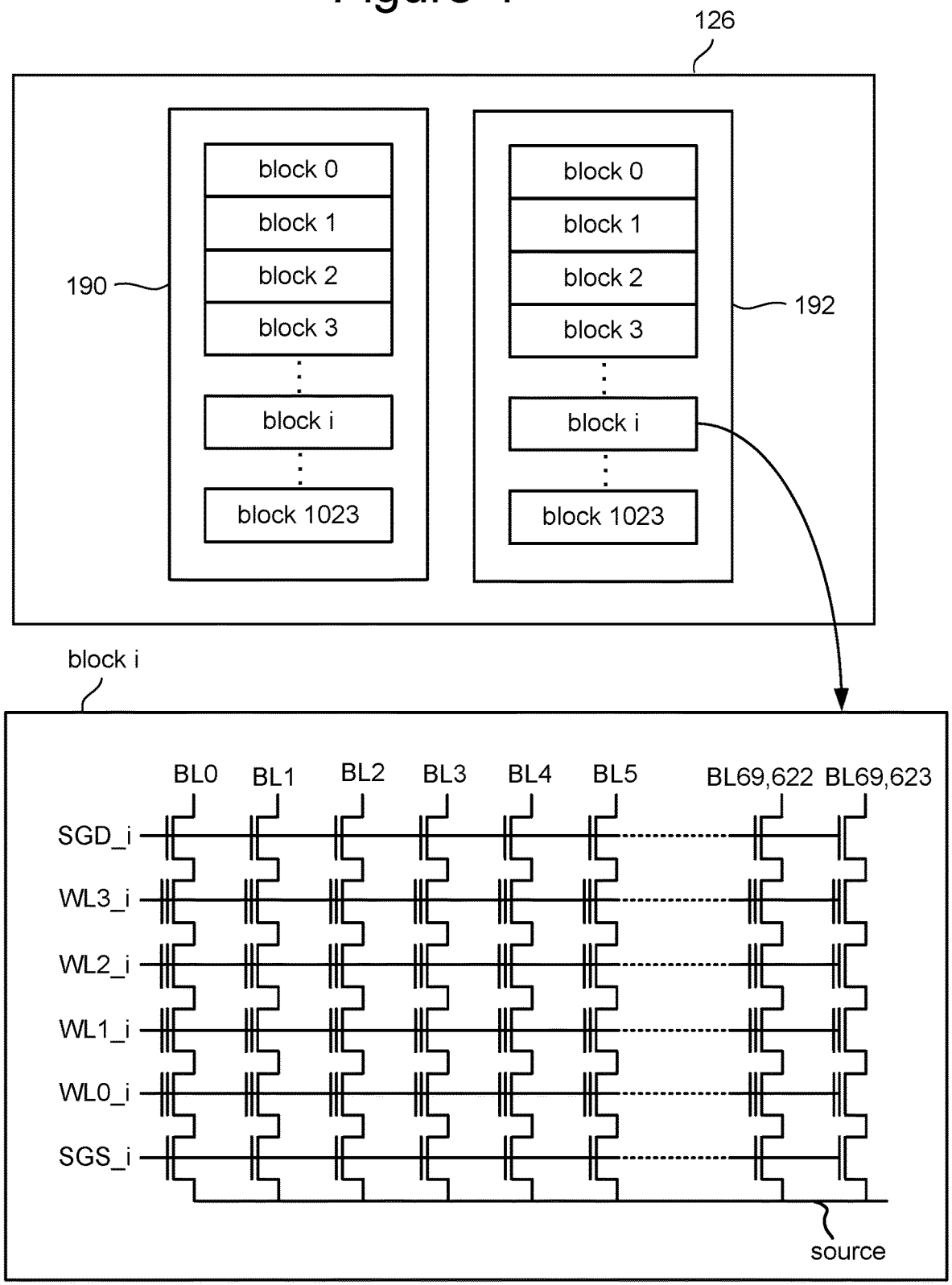
FIG. 4 is a block diagram of a non-volatile memory structure.

FIG. 4 depicts an example of memory structure 126. In one embodiment, an array of memory cells is divided into multiple planes. In the example of FIG. 4, memory structure 126 is divided into two planes: Plane 190 and Plane 192. In other embodiments, more or less than two planes can be used.

In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 4 includes memory cells that share word lines WL0_$i$, WL1_$i$, WL2_$i$ and WL3_$i$ and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 4 shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS). Although FIG. 4 shows 69624 bit lines, a different number of bit lines can also be used. Additionally, as discussed above, the erase block can implement non-volatile storage technologies other than NAND flash memory.

Each memory erase block and/or each memory storage unit is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array.

In the example discussed above, the unit of erase is an erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data.

In certain memory technologies, the size of data units for other memory/storage operations such as reading or erasing are fixed size units compatible with a memory storage unit size. Typically, a memory read unit size is compatible with a memory storage unit size when the size of the memory read unit divides evenly into the memory storage unit size. Typically, a memory erase unit size is compatible with a memory storage unit size when the size of the memory erase unit is a size that is evenly divided by the memory storage unit size.

In certain embodiments, a complete memory storage unit is sized to match the number of physical memory cells across a row of the memory structure 126. In one embodiment, an incomplete memory storage unit has fewer physical memory cells than a complete memory storage unit.

Figure 5:
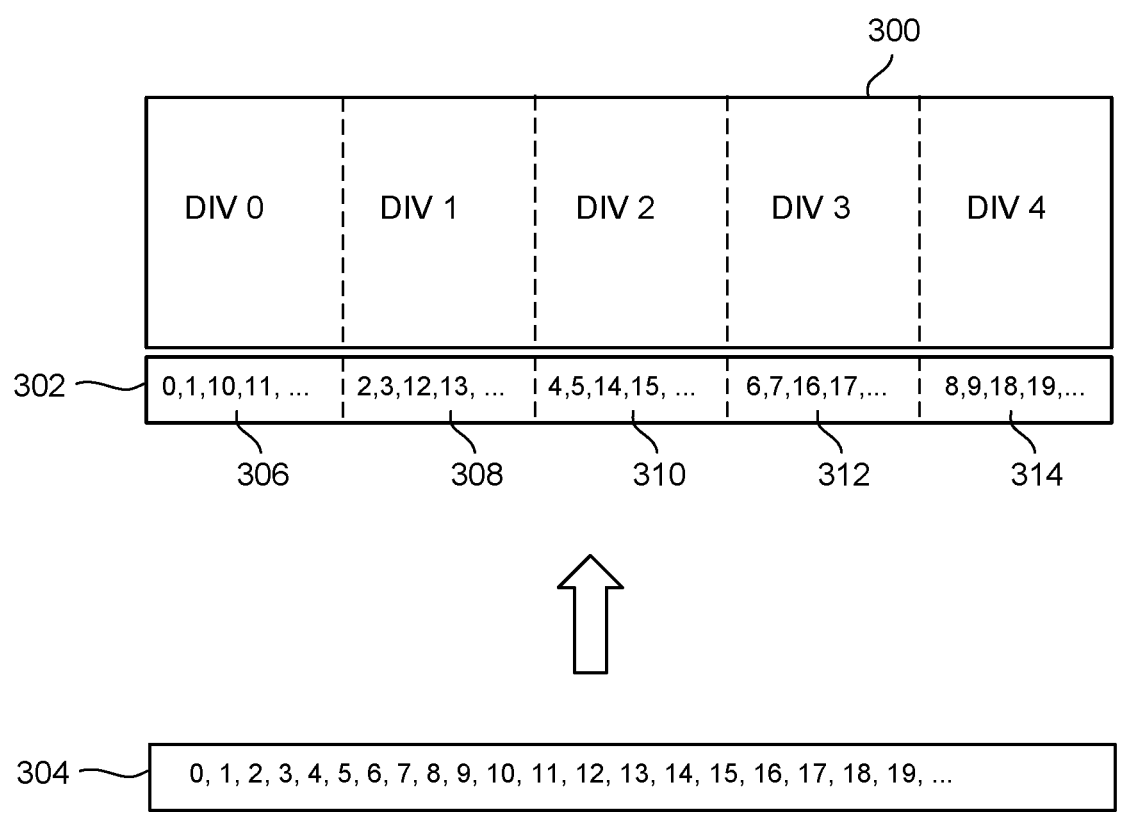
FIG. 5 depicts a plane divided into divisions and explains one embodiment of how data is mapped.

FIG. 5 depicts a plane 300 divided into divisions, and explains one embodiment for how data is mapped when storing that data in the plane 300. In one embodiment, plane 300 of FIG. 5 can be either of the planes 190 and 192 depicted in FIG. 4. Other embodiments could have more than two planes, and any of, or all of, those planes can be utilized as depicted and described by FIG. 5. In the embodiment of FIG. 5, plane 300 is divided into five divisions (or portions), including DIV 0, DIV 1, DIV 2, DIV 3 and DIV 4. A division is a set of memory cells and may be organized into an array of rows and columns. In other embodiments, more or less than five divisions can be used. Those of skill in the art will recognize that the number of bits or bytes that can be stored in each row and the number of rows in each DIV can vary for each embodiment and may be based on a variety of design considerations including the type of memory technology being used, the size of memory storage units, the size of units for read operations, and the like. In one embodiment, each memory storage unit is divided into the five divisions. In an embodiment where an erase block is a memory storage unit, the memory erase block is divided into five divisions.

FIG. 5 also shows register 302. In one example embodiment, register 302 includes one bit for each sense amplifier that can access a common memory storage unit. This example embodiment could include one bit in register 302 for each bit line. In other embodiments, the number of bits in register 302 can be more or less than the number of sense amplifiers or more or less than the number of bit lines. In one embodiment, register 302 can be formed from a plurality of latches, a plurality of flip flops, memory or other storage devices. As used herein, a register is one example of a buffer, which is a component that holds information.

FIG. 5 shows register 302 divided into five sections (or portions), including sections 306, 308, 310, 312 and 314. Section 306 of register 302 stores data to be programmed into memory cells in DIV 0. Section 308 of register 302 stores data to be programmed into memory cells in DIV 1. Section 310 of register 302 stores data to be programmed into memory cells in DIV 2. Section 312 of register 302 stores data to be programmed into memory cells in DIV 3. Section 314 of register 302 stores data to be programmed into memory cells in DIV 4. In one embodiment, the five divisions are equally sized. In other embodiments, the divisions could be of different sizes.

When data is received at memory die 108 to be programmed into a plane (e.g. memory plane 300), the data is mapped (which includes changing the layout or organization of the data or otherwise re-aligning the data). This makes the data fault tolerant because if there is a problem in the memory, the affected bits will be spread out among a page of data, making the data easier to recover using error correction. Box 304 shows an example of data to be input and stored into plane 300. Each of the numbers in box 304 ("0, 1, 2, 3, 4, 5, 6, 7, 8, 9, 10, 11, 12, 13, 14, 15, 16, 17, 18, 19, . . . ") represents one byte of data. One embodiment of mapping includes sending two bytes of data to each division and then repeating such that the system will alternatively place two bytes in each division in a rotating manner. For example, byte 0 and byte 1 are first sent to section 306 of register 302 to be programmed into DIV 0. Bytes 2 and 3 are sent to section 308 of register 302 to be stored in DIV 1. Bytes 4 and 5 are sent to section 310 of register 302 to be stored in DIV 2. Bytes 6 and 7 are sent to section 312 of register 302 to be stored in DIV 3. Bytes 8 and 9 are sent to section 314 of register 302 to be stored in DIV 4. At this point, two bytes have been placed in the appropriate register locations to be programmed in each of the divisions. Subsequently, the bytes will start being stored back in DIV 0. For example, bytes 10 and 11 will be stored in section 306 of register 302 for programming into DIV 0. Bytes 12 and 13 will be stored in section 308 of register 302 to be programmed into DIV 1. Bytes 14 and 15 will be stored in section 310 of register 302 to be programmed into DIV 2. Bytes 16 and 17 will be stored in section 312 of register 302 to be programmed into DIV 3. Bytes 18 and 19 will be stored in section 314 of register 302 to be programmed into DIV 4. This process will continue. Another alternative for mapping includes changing divisions after one byte. For example, byte 0 is stored in DIV 0, byte 1 is stored in DIV 1, byte 2 is stored in DIV 2, byte 3 is stored in DIV 3, byte 4 is stored in DIV 4, byte 5 is stored in DIV 0, etc. Other mapping techniques can also be used.

FIG. 6 shows a partial memory die 350, which includes an incomplete memory structure. As used herein, an incomplete memory structure is a memory structure that is missing components that it was designed to have. In certain embodiments, an incomplete memory structure is fabricated due to a fabrication side effect. As described herein, there are a variety of potential fabrication side effects. One example of a fabrication side effect may be, that the partial memory die 350 was positioned near an edge of a wafer such that the incomplete memory structure of the partial memory die is missing a portion that was not printed (or otherwise fabricated) on the wafer. That is, the incomplete memory structure of the partial memory die is missing components MC that should be part of the memory structure but they were not printed on the wafer because the die was positioned near the edge of the wafer, as explained above with respect to die G of FIG. 1. Another possible fabrication side effect may be misalignment of a wafer dicing machine such that parts of a die are cut during a dicing operation.

The incomplete memory structure of partial memory die 350 includes two planes: Plane 0 and Plane 1. In other embodiments, the memory structure can include more than two planes. Plane 0 is complete, meaning that it is not missing any portion or components. In the example of FIG. 6, Plane 1 is incomplete, meaning that Plane 1 is missing a portion of the plane that is supposed to be there. FIG. 6 shows that Plane 1 is missing components MC that were not printed on the die because the die was at the edge of the wafer. Thus, Plane 1 is missing components MC corresponding to components found in Plane 0. In one embodiment, Plane 1 is complete and Plane 0 is missing components. In another embodiment, both Plane 1 and Plane 0 include missing components. In one embodiment, a complete memory die (or a complete plane of a memory die) may comprise a rectangular shape. Partial memory die 350 and Plane 1 are rectangular in shape except for the missing portion (e.g., missing components MC). In other embodiments, a complete memory die and a complete plane may have other shapes.

The missing components MC can include portions of the substrate, memory cells, entire NAND strings, portions of or entire bit lines, portions of or entire word lines, portions of or entire select lines and dielectric regions. In some embodiments, Plane 1 (or the incomplete memory array) comprises a plurality of memory storage units. Some of the memory storage units are complete memory storage units, meaning that they are not missing any components. Some of the memory storage units are incomplete memory storage units, meaning that they are missing components that they were intended to have and that correspond to components that complete memory storage units have. The incomplete memory storage units are referred to as physically partial memory storage units because they are missing memory components corresponding to memory components found in complete memory storage units, including missing silicon components corresponding to silicon components found in complete memory storage units. For example, the physically partial memory storage units (incomplete memory storage units) are missing non-volatile memory cells, bit lines, portions of bit lines, word lines, portions of word line and portions of substrate corresponding to respective memory cells, bit lines, portions of bit lines, word lines, portions of word line and portions of substrate found in complete memory storage units. The control circuits discussed herein are capable of successfully programming/writing, erasing and reading the physically partial memory storage units (incomplete memory storage units), as described below.

Plane 0 and Plane 1 have the same (ie common) address space size. For example, both planes may have intended to be storage for X gigabytes of data and have an address space big enough to address X gigabytes. Even though Plane 1 is incomplete, it still has the same address space size, even if it cannot use some of the address space due to missing memory cells.

The discussion below explains different embodiments for configuring partial memory die 350 to successfully perform programming and reading (i.e. successfully perform programming and reading of the incomplete memory structure/array).

Partial memory die 350 also include Support Circuit 351, which is connected to Plane 0 and Plane 1. The incomplete memory structure (including Plane 0 and Plane 1) and the support circuit together comprise a partial memory die. Support Circuit 351 includes one or more circuits that may be referred to as a control circuit for successfully programming, erasing and reading complete memory storage units and incomplete memory storage units. An example of Support Circuit 351 includes control circuitry 110 (including state machine 112), read/write circuits 128, decoders 124, and decoders 132 of FIG. 2. Other circuits can also be part of Support Circuit 351. The support circuit is configured to successfully program data to the incomplete memory storage unit and read data from the incomplete memory storage unit. Support circuit 351 is configured to write/program data to, and read data from, each memory storage unit regardless of whether the memory storage unit is a complete memory storage unit or an incomplete memory storage unit. However, the support circuit is adapted to change how it programs or reads, as discussed herein.

FIG. 6A shows partial memory die 350'. In FIG. 6, partial memory die 350 includes Plane 1 being incomplete. In FIG. 6A, partial memory die 350' includes Plane 0 being incomplete. As in FIG. 6, Support Circuit 351 is connected to Plane 0 and Plane 1. In another embodiment, Plane 0 and Plan 1 can be incomplete planes.

Figure 7A:
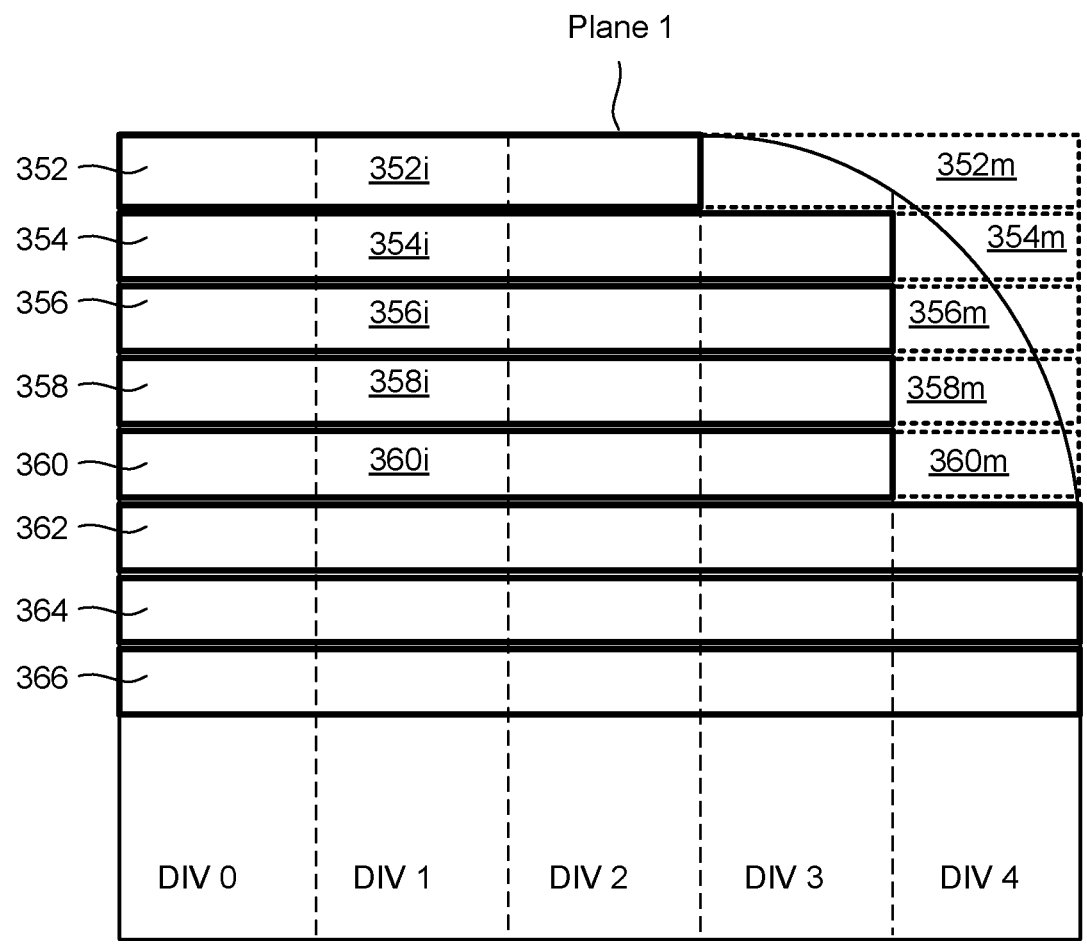
FIG. 7A depicts an incomplete plane of a partial memory die.

FIG. 7A depicts an incomplete plane (Plane 1) of partial memory die 350. FIG. 7A depicts that Plane 1 is divided into five divisions: DIV 0, DIV 1, DIV 2, DIV 3, and DIV 4 (as described above with respect to FIG. 5). In this example, the portions of Plane 1 that are DIV 0, DIV 1 and DIV 2 are complete (all components are intact). However, Plane 1 is incomplete because portions of DIV 3 and DIV 4 are missing due to partial memory die 350 having been printed/made on the edge of the corresponding wafer such that a portion of the circuit was not printed or fabricated on the wafer (see die G of FIG. 1). Therefore, DIV 3 and DIV 4 are incomplete. FIG. 7A shows a portion of Plane 1 divided into memory storage units. In a complete plane, one embodiment would include each memory storage unit traversing the width of the plane. In other embodiments, memory storage units can be a portion of the width. In the embodiment of FIG. 7A, each memory storage unit is supposed to be the width of the plane. For example, FIG. 7A shows memory storage units 352, 354, 356, 358, 360, 362, 364 and 366. In one embodiment, memory storage units 352, 354, 356, 358, 360, 362, 364 and 366 are memory erase blocks. Memory storage units 362, 364 and 366 are complete memory storage units and span the width of Plane 1. However, memory storage units 352, 354, 356, 358 and 360 are incomplete memory storage units that cannot span the width of Plane 1 because a portion of Plane 1 is missing. For example, memory storage units 352, 354, 356, 358 and 360 are missing intended bit lines or portions of bit lines. Therefore, memory storage unit 352 only spans across DIV 0, DIV 1 and DIV 2, and memory storage units 354-360 only span across DIV 0, DIV 1, DIV2 and DIV 3. Complete memory storage units 362, 364 and 366 span across DIV 0, DIV, 1, DIV 2, DIV3 and DIV 4. Therefore, memory storage unit 366 (for example) can store more user data than memory storage unit 352 because memory storage unit 352 is missing memory cells.

FIG. 7A shows portions of memory storage units 352, 354, 356, 358 and 360 with dashed lines to represent the portion of the memory storage units that are missing components. For example, memory storage unit 352 includes portion 352m which is missing memory components, memory storage unit 354 includes portion 354m which is missing memory components, memory storage unit 356 includes portion 356m which is missing memory components, memory storage unit 358 includes portion 358m which is missing memory components, and memory storage unit 360 includes portion 360m which is missing memory components. In certain embodiments, the missing components may be a part of a bit line or a part of a word line or all or part of a sense amplifier circuit that would have been fabricated in the MC area (See FIG. 6) if the substrate extended under the MC area during the fabrication process. FIG. 7A also shows portions of memory storage units 352, 354, 356, 358 and 360 with solid lines to represent the portion of the memory storage units that are present and not missing components. For example, memory storage unit 352 includes portion 352i, memory storage unit 354 includes portion 354i, memory storage unit 356 includes portion 356i, memory storage unit 358 includes portion 358i and memory storage unit 360 includes portion 360i. Thus, the memory storage units that have missing memory components are incomplete memory storage units.

To allow a partial memory die, or incomplete memory structure, to be utilized, information is tracked to identify what components are missing and what components are not missing. To accomplish this, in one embodiment, the memory die stores boundaries, or some other type of indication, of where the memory structure is incomplete, thereby providing an indication of the determined missing portions of the memory structure (e.g., an indication that the memory structure is incomplete). Alternatively, or in addition, the indication may identify where the memory structure is complete and the memory die may operate on the basis that memory components outside that boundary are incomplete. In one embodiment, the indication may serve to identify a memory structure or memory storage unit as an incomplete memory storage unit. In another embodiment, the indication may serve to identify which portion of a memory array is an incomplete memory storage unit and/or which is a complete memory storage unit. How these boundaries and/or indications are tracked and stored can vary depending on the memory technology of the memory cells (e.g. PCM, MRAM, NAND floating gate, NAND Charge trap, etc.) and the architecture (e.g. cross-point, 2D, 3D, vertical bit line, etc.) of the memory die.

Figure 7B:
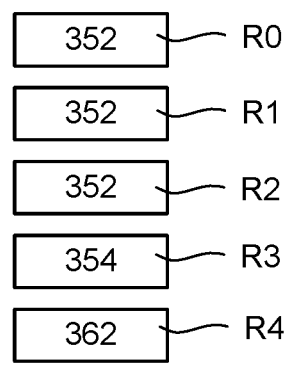
FIG. 7B depicts registers used to record an indication of missing portions of the memory structure.

FIG. 7B shows one example embodiment for storing such an indication of where the memory structure is incomplete and/or is complete. In this embodiment, the memory system will store five registers for each plane: R0, R1, R2, R3 and R4. Register 0 will indicate the first usable memory storage unit that is in DIV 0. In this case, memory storage unit 352-366 are in DIV 0. The first memory storage unit of those memory storage units 352-366 is memory storage unit 352. Therefore, register R0 will record an indication of memory storage unit 352. Register R1 stores an indication of the first useable memory storage unit in DIV 1. In the embodiment of FIG. 7A, memory storage unit 352-366 are in DIV 1; therefore, register R1 will store at memory storage unit 352 being the first usable memory storage unit in DIV 1. Register R2 stores an indication of the first usable in DIV 2. In the embodiment of FIG. 7A, memory storage unit 352-366 are in DIV 2; therefore, register R2 will store at memory storage unit 352 being the first usable memory storage unit in DIV 2. Register R3 stores an indication of the first usable memory storage unit in DIV 3. In the embodiment of FIG. 7A, memory storage unit 354 is the first memory storage unit that can be used in DIV 3; therefore, register R3 will record an indication of memory storage unit 354. This is because memory storage unit 352 has been redistricted to not include any portion of DIV 3. Register R4 stores indication of the first usable memory storage unit DIV 4. In the embodiment of FIG. 7A, memory storage unit 362 is the first memory storage unit that can be used in DIV 4; therefore, register R4 will store an indication of memory storage unit 362. Registers R0-R4 are just one example of buffers that store boundaries of where a plane is incomplete, and other types of buffers can also be used. Other embodiments and variations are contemplated and within the scope of the claims recited herein.

Note that FIG. 7A only shows eight memory storage units; however, it is contemplated that Plane 1 would include more than eight memory storage units. However, eight memory storage units are depicted for example purposes. Additionally, a memory system could include more or less than five divisions. In other embodiments, the indication of the determined missing portions of the memory structure can be stored in less than five registers or more than five registers, as well as in a different manner than as depicted in FIG. 7B. However by reading the indication (which can include one or more data values) provided by the registers, the system can determine what components are missing so that it does not try to store data in the missing components.

Figure 8:
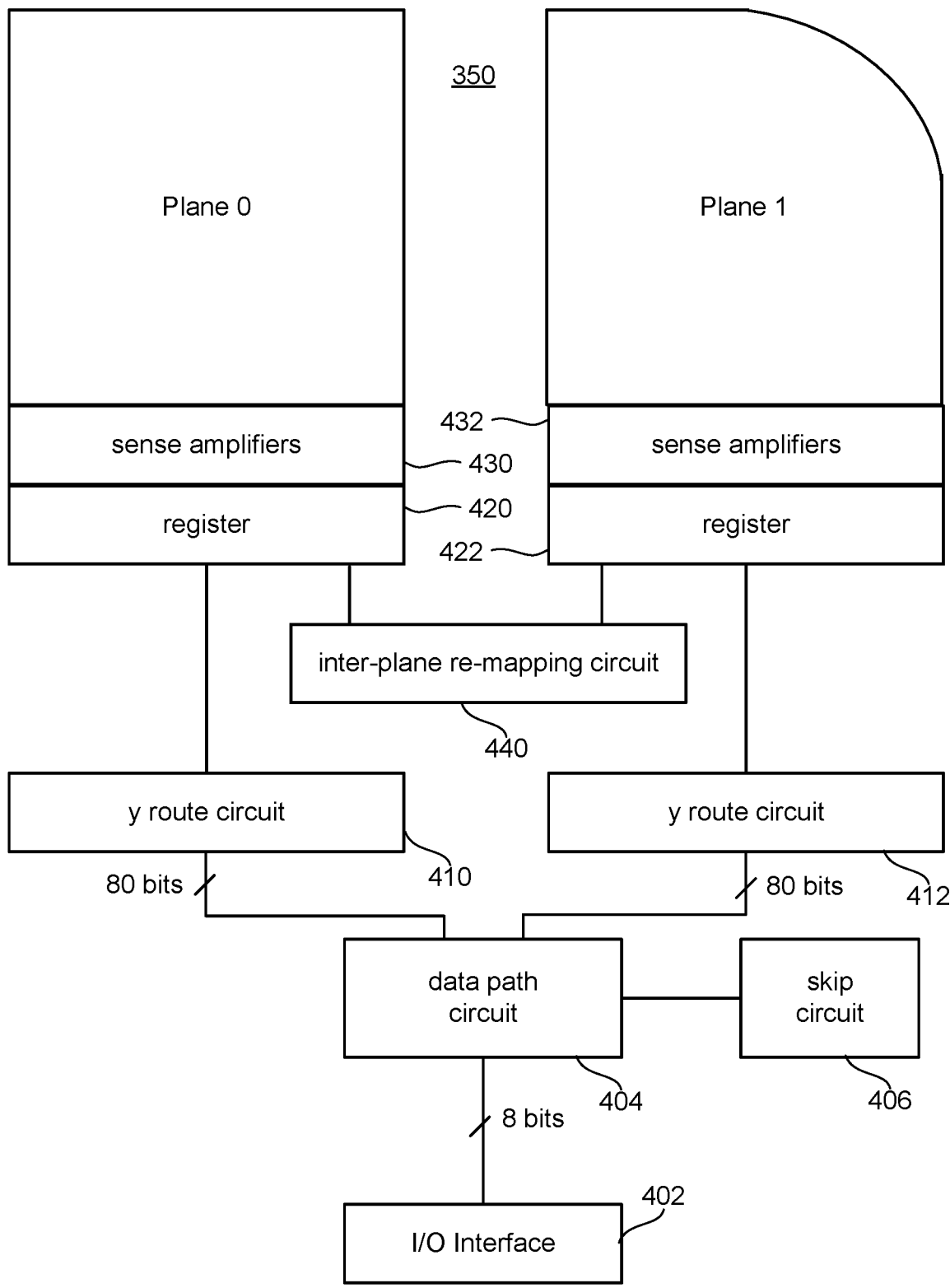
FIG. 8 depicts portions of one embodiment of a partial memory die.

FIG. 8 is a partial system block diagram that depicts portions of one embodiment of partial memory die 350, including Plane 0 and Plane 1. In this example, it is assumed that Plane 1 is an incomplete plane, as depicted in FIG. 6 and FIG. 7A. The components of FIG. 8 include input/output interface (I/O interface) 402. In one embodiment, the memory system is encapsulated as a single integrated circuit and I/O interface 402 includes a set of pins, leads, I/O pads, etc. In other embodiments, memory die 350 will include a set of I/O pads or other interfaces. In one example, I/O interface 402 implements a Toggle Mode interface; however, other interfaces can also be used. One example of the suitable Toggle Mode interface is provided in the following table:

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus[0:7] | Input/Output | Data Input/Output (I/O) bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |

As described in the table above, the data bus into partial memory die 350 is 8 bits wide. These 8 bits are provided from I/O interface 402 to data path circuit 404 which aggregates bytes of data together and outputs the data (as parallel data) on an 80 bit bus. In one embodiment, the 80 bit bus is presented to both Y route circuit 410 and Y route circuit 412. In other embodiments, the output of data path can be switched so it is only provided to one of circuits 410 and 412. In addition to aggregating the data, data path circuit 404 can perform all or a portion of the mapping of data, as discussed above with respect to FIG. 5. Data path circuit 404 is in communication with skip circuit 406. In one embodiment, skip circuit 406 is used to cause data path circuit 404 to skip certain bit lines or columns of bit lines (or portions of the page or data) because of defective components in either one of Plane 0 or Plane 1. In other embodiments, the skip circuit 406 can be used to program data path circuit 404 to properly map the data and/or re-map the data. Note that defective components are different than missing components of an incomplete memory storage unit because defective components are present but have a problem while missing components are not present.

The output of data path circuit 404 is 80 bits (10 bytes). As per the mapping described above, the 10 bytes will be stored into the respective planes by putting two bytes in each division of the plane, as described above with respect to FIG. 5. If the data is to be stored in Plane 0, then the data from data path circuit 404 is provided toy route circuit 410. If the data is to be stored in Plane 1, then the data output from data path circuit 404 is provided to y route circuit 412. Y route circuits 410 and 412 are used to distribute the data into the different locations within each division. Looking back at FIG. 5, y route circuit 410 would first distribute byte 0 and byte 1 into the first two bytes for DIV 0 and subsequently distribute byte 10 and byte 11 to the second position (second two bytes) of DIV 0, etc. In some embodiments, y route circuit 410 and 412 can also perform all or a subset of the mapping described by in FIG. 5. The output of the y route circuit 410 is connected to register (or buffer) 420. In one embodiment, register 420 includes one bit per sense amp. Register 420 is analogous to register 302 of FIG. 5. Register 420 can comprise flip flops, latches, memory, a data buffer, etc. Sense amplifiers 430 use the data in register 420 to program Plane 0. As mentioned above, as used herein, a register is one example of a buffer, which is a component that holds information.

The output of y route circuit 412 is provided to register 422 (or buffer). Register 422 is also analogous to register 302 of FIG. 5. In one embodiment, there can be one bit in register 422 for each sense amplifier. Sense amplifier 432 uses the data in register 422 to program Plane 1. On other embodiments, register 422 can have more or less bits than the number of sense amplifiers. Note that sense amplifiers 430 and 432 correspond to (and are included in) sense blocks 150 of FIG. 2. In one embodiment, register 420 and 422 can include 16 k bits, and the output of y route circuits 410 and 412 can also be 16 k. In other embodiments, the width of registers and the width of the output of the y route circuits can be less than 16 k.

FIG. 8 also shows inter-plane re-mapping circuit 440 directly connected to register 420 and directly connected to register 422. Inter-plane re-mapping circuit 440 re-maps data from one of registers (buffers) 420/422 and stores the re-mapped data in the other register (buffer) for programming. For example, inter-plane re-mapping circuit 440 can re-map data from register (or buffer) 420 and store the re-mapped data in the register (or buffer) 422 for programming into Plane 1 or re-map data from register (or buffer) 422 and store the re-mapped data in the register (or buffer) 420 for programming into Plane 0. The re-mapping avoids missing components (e.g., avoid the missing components MC of FIG. 6), such as re-mapping data from missing bit lines to existing bit lines. In one example, embodiment, inter-plane re-mapping circuit 440 re-maps the data from register (or buffer) 420 by aligning the data with complete portions of the Plane 1 and not aligning the data with an incomplete portion of the plane 1. The re-mapping of the data includes changing the layout or organization of the data. More detail is provided below with respect to FIG. 9.

In one embodiment, inter-plane re-mapping circuit 440 reads the data from register 420, re-maps the data and then stores the re-mapped data in register 422. In other embodiments, inter-plane re-mapping circuit 440 can read the data from register 422, re-map the data and store the re-mapped data in register 420. When reading data from Plane 1, the data can be read out from register 422 by inter-plane re-mapping circuit 440 to reverse the re-mapping and provide the reversed re-mapped data (just mapped data) to register 420. The use of inter-plane re-mapping circuit 440 allows for the incomplete plane to be programmed and read, including programming data to and reading from an incomplete memory storage unit (physically partial memory storage unit). In one embodiment, inter-plane re-mapping circuit 440 can be implemented using flip flops and multiplexors, as well as various types of switches. In one embodiment, state machine 112 is connected to and controls y route circuit 410, y route circuit 412, registers 420, registers 422, sense amplifiers 430, sense amplifiers 432, skip circuit 406, I/O interface 402 and data path circuit 404.

In one example implementation, partial memory die 350 includes a high speed data path implemented by I/O interface 402 and a portion of data path circuit 404. Inter-plane re-mapping circuit 440 is used in order to leave that high speed data path intact so that data is loaded in the same efficient and high speed manner, whether the intended target memory storage unit is a complete memory storage unit or incomplete memory storage unit.

When the system seeks to write data to a memory storage unit, state machine 112 checks the registers depicted in FIG. 7B to determine whether the target memory storage unit is a complete memory storage unit (e.g., memory storage units 362-366 of FIG. 7A) or an incomplete memory storage unit (e.g. memory storage units 352-360 of FIG. 7A). If the target memory storage unit is a complete memory storage unit (and the target memory storage unit is in Plane 1), then the data will be provided via I/O interface 402 through data path circuit 404, through y route circuit 412 to register 422 for programming into Plane 1 by sense amplifiers 432.

If state machine 112 (or in another embodiment, the controller) determines (based on checking the registers of FIG. 7B) that the data is to be stored in a memory storage unit that is an incomplete memory storage unit in Plane 1, then state machine 112 configures inter-plane re-mapping circuit 440 and other components of FIG. 8 to align the data with the complete portions of Plane 1 and not align the data with incomplete portions of Plane 1. For example, the data is sent via I/O interface 402 and data path circuit 404 to y route circuit 410 for storage in register 420 (register for the complete plane). The data will not be programmed into Plane 0. Rather, the data will be transferred from register 420 to register 422 via inter-plane re-mapping circuit 440. While transferring the data from register 420 to register 422, the inter-plane re-mapping circuit will re-map the data in order to align the re-mapped data with the complete portions of Plane 1 and not align the re-mapped data with the incomplete portions of plane 1. Looking back at the example of FIG. 7A, assume for example purposes that data is to be programmed into memory storage unit 352. That data would first be stored in register 420. When data path circuit 404 and/or y route circuit 410 are used to map the data, data will be stored in register 420 for all five divisions. The data will then be passed through inter-plane re-mapping circuit 440 and re-mapped so that data is only presented for divisions DIV 0, DIV 1 and DIV 2 when stored in register 422. This is depicted graphically by FIG. 9 which shows incoming data 540 being mapped 541 by data path circuit 404 and/or y route circuit 410 for storage in register 420 of Plane 0. The mapping of data 540 into register 420 is done in the same manner as described above with respect to FIG. 5. Therefore, bytes 0, 1, 10 and 11 and are stored in section 420-0 of register 420; bytes 2, 3, 12, and 13 are stored in section 420-1 of register 420; bytes 4, 5, 14, and 15 are stored in section 420-2 of register 420; bytes 6, 7, 16 and 17 are stored in section 420-3 of register 420; and bytes 8, 9, 18 and 19 are stored in section 420-4 of register 420.

Arrow 542 represents the data being re-mapped by inter-plane re-mapping circuit 440 while being transferred from Plane 0 To Plane 1 (inter-plane). As can be seen, the system will alternatively place two bytes in each division in a rotating manner but use only the divisions available to the memory storage unit currently being programmed. For example, when programming memory storage unit 352 of Plane 1, only divisions DIV 0, DIV 1 and DIV 2 are available. Therefore, data is stored in section 422-0 of register 422 for programming to DIV 0, section 422-1 of register 422 for programming into DIV 1 and section 422-2 of register 422 for programming into DIV 2. There is no data stored in sections 422-3 and 422-4 of register 422 because data cannot be stored in DIV 3 or DIV 4 for memory storage unit 352. As can be seen from FIG. 9, the data is still stored in the register two bytes at a time in a round robin fashion so that byte 0 and 1 are stored in section 422-0, bytes 2, 3 are stored in section 422-1, bytes 4, 5 is stored in section 422-2, 6, 7 are stored in section 422-0, bytes 8, 9 are stored in section 422-1, etc. In one embodiment, once all of the data is loaded into register 422-0, it is concurrently programmed into the memory cells connected to the same word line but different bit lines.

In the example of FIG. 8, Plane 1 is incomplete. However, it is possible that Plane 0 is an incomplete plane. If Plane 0 is an incomplete plane, then the circuits of FIG. 8 can also be used to re-map data for programming into Plane 0. That is data for an incomplete memory storage unit of Plane 0 will first be stored in register 422. That data will then be accessed and re-mapped by inter-plane re-mapping circuit 440, and stored in register 420 for programming into Plane 0.

Figure 10:
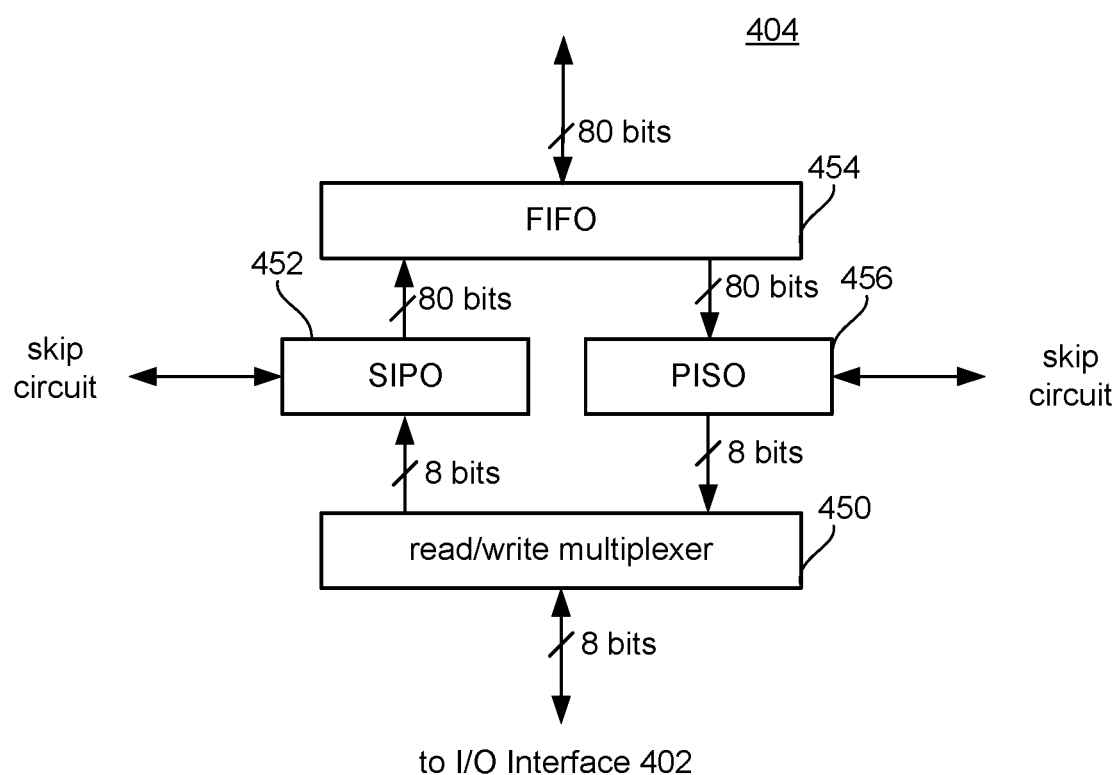
FIG. 10 depicts one embodiment of a data path circuit.

FIG. 10 is a block diagram describing one embodiment of data path circuit 404. FIG. 10 shows read/write multiplexor 450 receiving/sending 8 bits from/to I/O interface 402. Read/write multiplexor 450 is connected to and provides an 8 bit output to serial-in-parallel-out ("SIPO") circuit 452. Read/write multiplexor 450 is also connected to and receives 8 bits from parallel-in-serial-out ("PISO") circuit 456. SIPO 452 provides 80 bits to first-in-first-out buffer 454. PISO 456 receives 80 bits from FIFO 454. FIFO 454 provides or receives 80 bits from either or both of register 420 and register 422. Data received by read/write multiplexor 450 from the Toggle Mode interface described above is provided to SIPO 452. SIPO 452 aggregates ten-8 bit messages (bytes) received serially into one larger 80 bit message (parallel) and provides that 80 bit message to FIFO 454. When data is read from partial memory die 350, the data is provided to FIFO 454. Data read that is stored in FIFO 454 is provided as 80 bit messages to PISO 456, which deconstructs the 80 bit message into ten 8-bit messages (bytes). PISO 456 sends those ten 8-bit messages serially to read/write multiplexor 450, which provides the data to the output of the partial memory die (i.e. I/O interface 402). Both FIFO 454 and read/write multiplexor 450 are controlled by state machine 112 (see FIG. 2) to operate between read mode and program mode (write mode).

Figure 11:
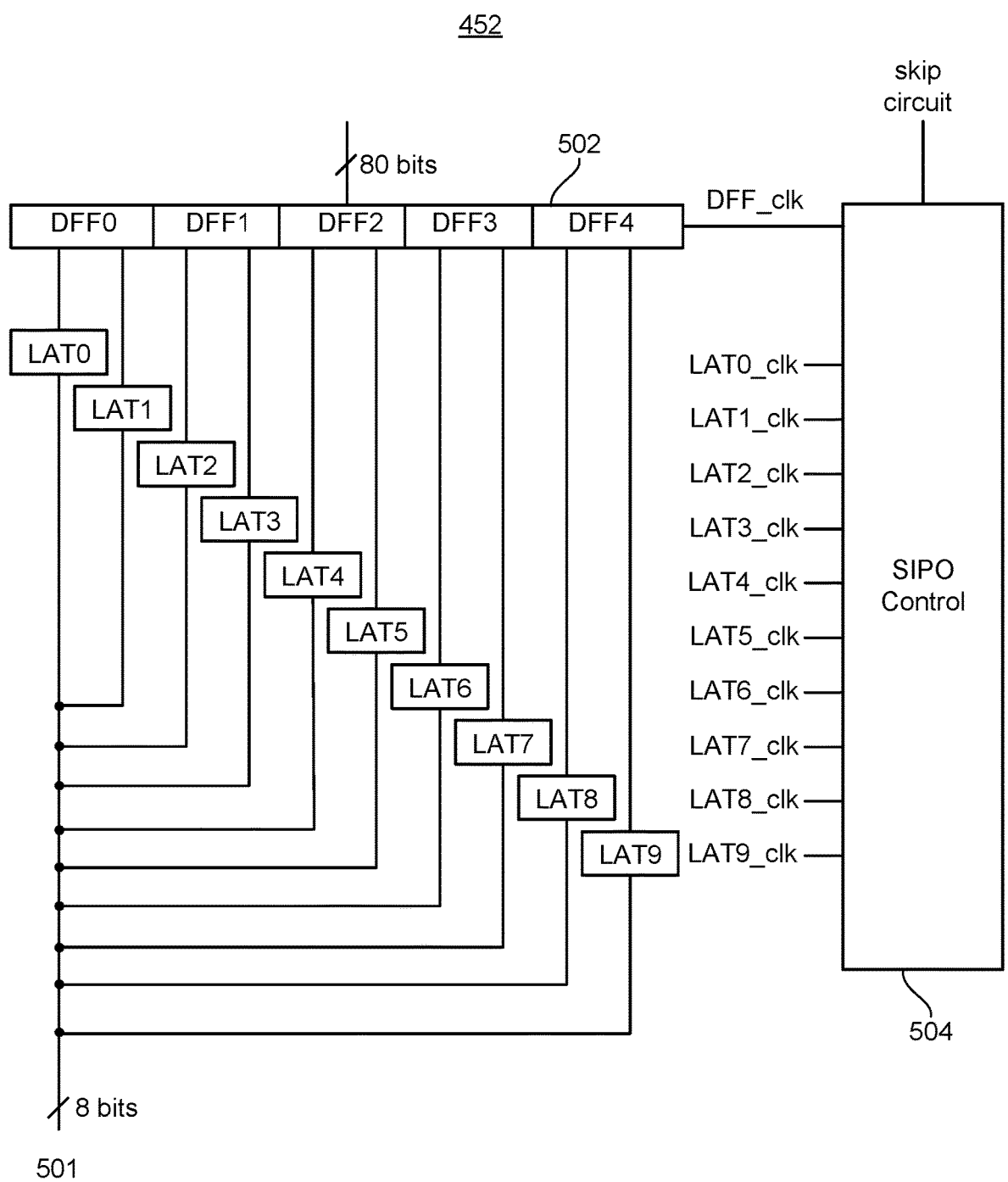
FIG. 11 depicts one embodiment of a serial-in-parallel-out circuit.

FIG. 11 depicts one example of SIPO circuit 452. Eight bits of data are received at input 501 and provided to the input of ten 8 bit latches: LAT0, LAT1, LAT2, LAT3, LAT4, LAT5, LAT6, LAT7, LAT8, and LAT9. SIPO control circuit 504 provides clock signal for all ten latches. Clock signal LAT0_clk is the clock signal for latch LAT0, clock signal LAT1_clk is the clock signal for latch LAT1, clock signal LAT2_clk is the clock signal for latch LAT2, clock signal LAT3_clk is the clock signal for latch LAT3, clock signal LAT4_clk is the clock signal for latch LAT4, clock signal LAT5_clk is the clock signal for latch LAT5, clock signal LAT6_clk is the clock signal for latch LAT6, clock signal LAT7_clk is the clock signal for latch LAT7, clock signal LAT8_clk is the clock signal for latch LAT8, and clock signal LAT9_clk is the clock signal for latch LAT9. FIG. 11 does not show the clock signals connecting to the corresponding latches in order to keep FIG. 11 readable, however, the clock signals are connected to the corresponding clock inputs of each of the latches. The output of latches LAT0 and LAT1 are provided to D flip flops DFF0 (16 bits). The output of latches LAT2 and LAT3 is provided to D flip flops DFF1. The output of latches LAT4 and LAT5 are provided to D flip flops DFF2 (16 bits). The output of latches LAT6 and LAT7 are provided to D flip flops DFF3 (16 bits). The output of latches LAT8 and LAT9 are provided to D flip flops DFF4 (16 bits). D flip flops DFF0, DFF1, DFF2, DFF3 and DFF4 combine to form register 502 which is an 80 bit register. Each latch stores 8 bits of data. SIPO control circuit 504 is used to activate the latches sequentially so that ten bytes of serial data are sequentially loaded in latches LAT0-LAT9. After the 10th byte is loaded, all 10 latches will then each be storing 8 bits of data. At that point, the flip flops DFF0-DFF4 will clock in the data from the latches such that register 502 will now store the 80 bits of data as parallel data. Register 502 is clocked based on clock signal DFF_clk from SIPO control circuit 504. In one embodiment, SIPO control circuit 504 is connected to and controlled by state machine 112.

Figure 12:
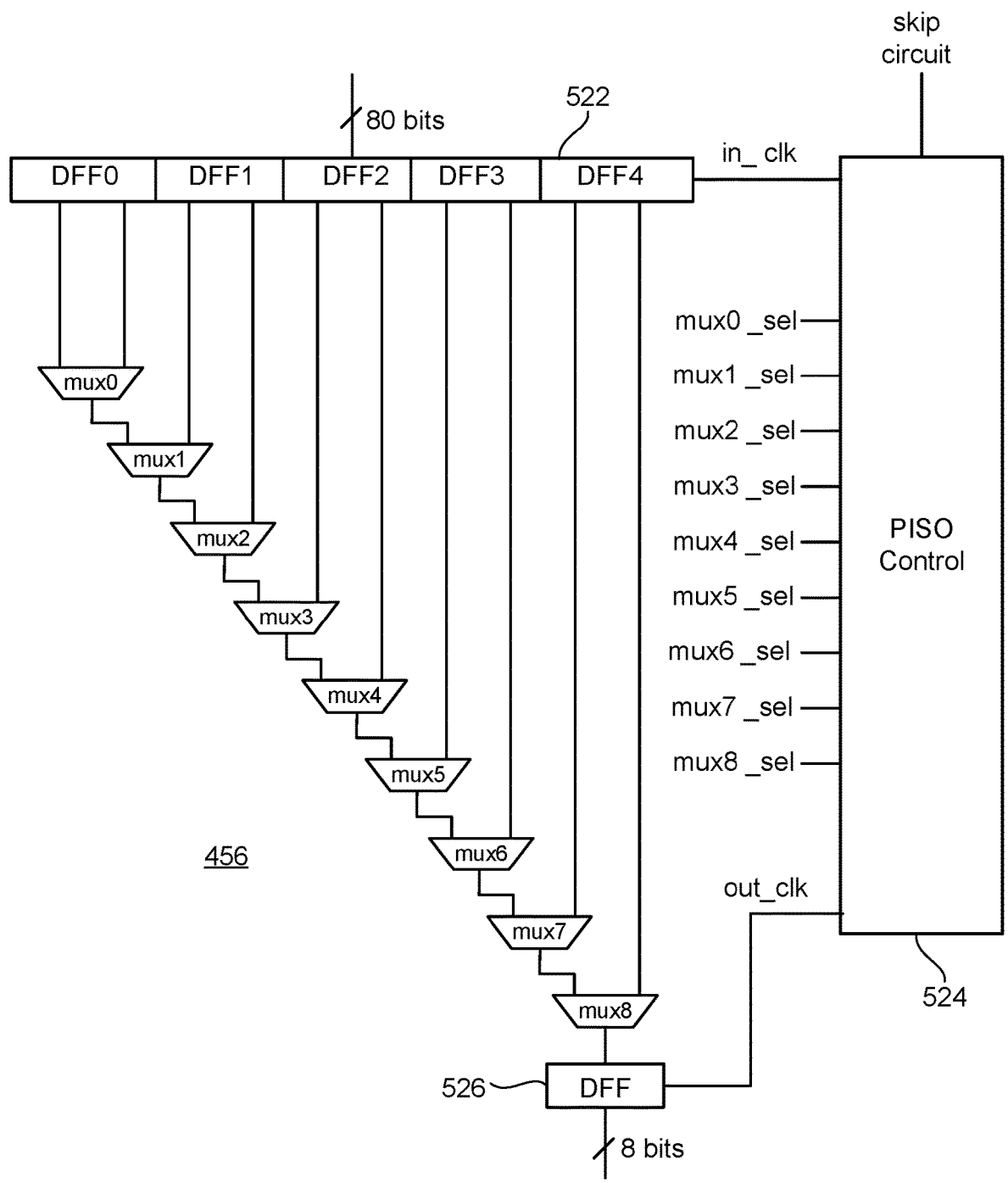
FIG. 12 depicts one embodiment of a parallel-in-serial-out circuit.

FIG. 12 depicts one example embodiment of PISO circuit 456. Eighty bits are received at the input of PISO circuit 456 and stored in register 522 in response to clock signal in clk from PISO control circuit 524. Note that PISO control circuit 524 receives a signal from skip circuit 406 (see FIG. 8). PISO control circuit 524 is also connected to and controlled by the state machine 112. Register 522 comprises five sets of D flip flops, each being 16 bits wide: DFF0, DFF1, DFF2, DFF3 and DFF4. The output of flip flops DFF0 are provided to mux0 such that the first byte of DFF0 is provided to the first input of mux0 and the second byte of flip flops DFF0 is provided to the second byte of mux0. The output of mux0 is provided to the first input of mud. The first byte of flip flops DFF1 is provided to the second input of mux1. The output of mux1 is provided to the first input of mux2. The second byte of flip flops DFF1 is provided to the second input of mux2. The output of mux2 is provided to the first input of mux3. The first byte of flip flops DFF2 is provided to the second input of mux3. The output of mux3 is provided to the first input of mux4. The second byte of flip flops DFF2 is provided to the second input of mux4. The output of mux4 is provided to mux5. The first byte of flip flops DFF3 is provided to the second input of mux5. The output of mux5 is provided to the first input of mux6. The second byte of flip flops DFF3 is provided to the second input of mux6. The output of mux6 is provided to the first input of mux7. The first byte of flip flops DFF4 is provided to the second input of mux7. The output of mux7 is provided to the first input of mux8. The second byte of flip flops DFF4 is provided to the second input of mux8. The output of mux8 is provided to D flip flops 526, which holds 8 bits of data. Each of the multiplexors mux0-mux8 select one of the two input bytes to provide at its output based on its respective selection signal. PISO control 524 provides mux0_sel as the selection signal for mux0, mux1_sel as the selection signal for mux1, mux2_sel as the selection signal for mux2, mux3_sel as the selection signal for mux3, mux4_sel as the selection signal for mux4, mux5_sel as the selection signal for mux5, mux6_sel as the selection signal for mux6, mux7_sel as the selection signal for mux7, and mux8_sel as the selection signal for mux8. Additionally, PISO control circuit 524 provides the clock signal (out_clk) as the clock signal for D flip flops 526. The circuit of FIG. 11 allows any one of the ten bytes stored in register 522 to be provided as the output from D flip flops 526. Therefore, this parallel data is provided at an output as serial data. PISO control can provide each of those bytes sequentially so that the parallel data is now presented sequentially as serial data.

Figure 13:
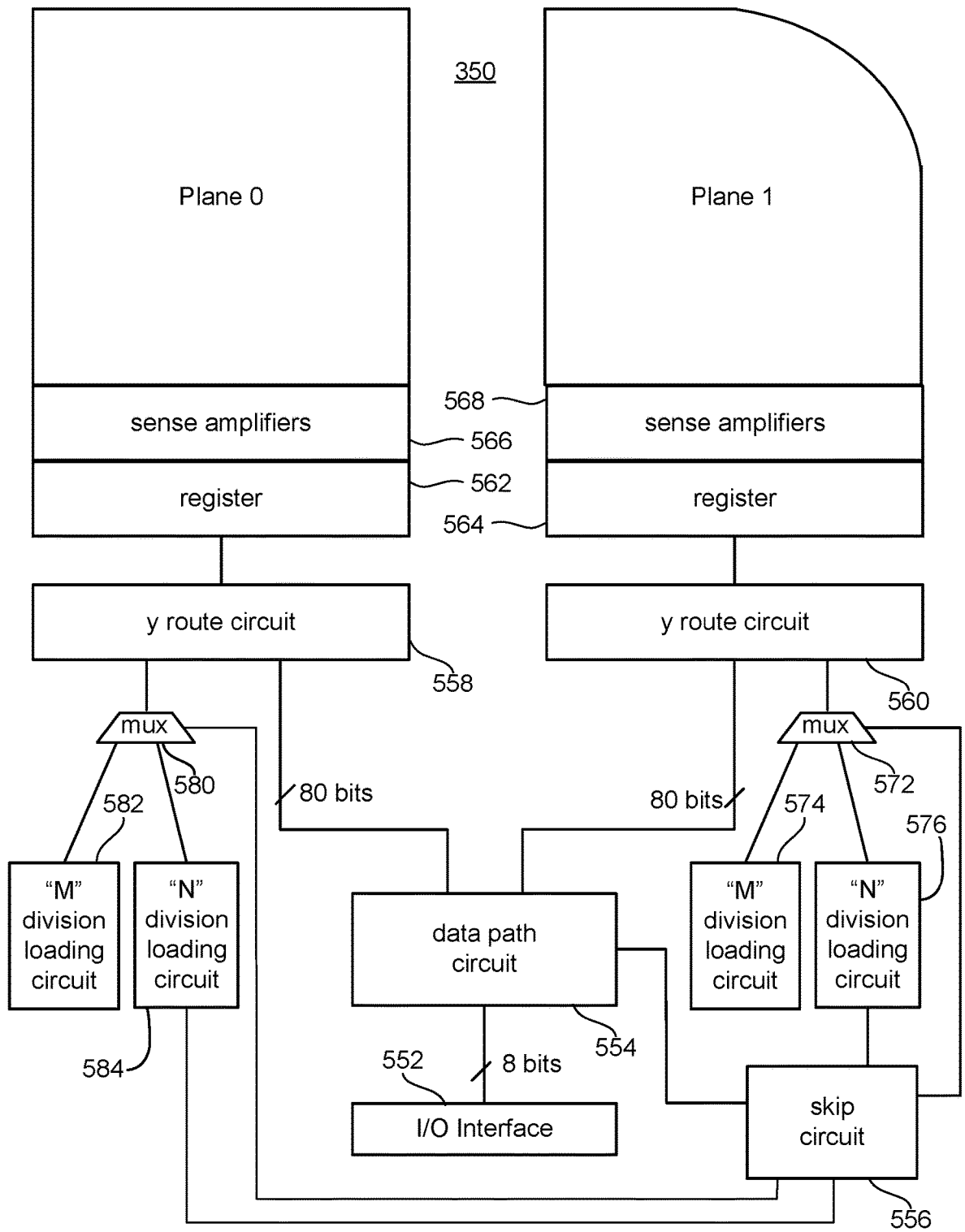
FIG. 13 depicts portions of one embodiment of a partial memory die.

FIG. 13 depicts another embodiment of partial memory die 350, including Plane 0 and Plane 1, that includes an inter-plane re-mapping circuit for re-mapping data. In this example, Plane 1 is incomplete; however, the circuits of FIG. 13 can also be used to re-map data for programming into Plane 0 when Plane 0 is incomplete. FIG. 13 shows I/O interface 552, analogous to I/O interface 402 of FIG. 8. I/O interface 552 is connected to data path circuit 554 which (in some embodiments) is the same structure as depicted in FIG. 10. Data path circuit 554 is connected to y route circuit 558 and y route circuit 560. Y route circuit 558 connects to register (or buffer) 562. Y route circuit 560 connects to register (or buffer) 564. Sense amplifiers 566 program Plane 0 based on the data in register 562. Sense amplifiers 568 program Plane 1 based on the data in register 564. In the embodiment of FIG. 13, y route circuit 558 and y route circuit 560 map the data as described above with respect to FIG. 5. M division loading circuit 582 is used to control y route circuit 558 in order to map the data among M divisions (e.g., 5 divisions). N division loading circuit 584 is used to control y route circuit 560 to map the data among N divisions. M division loading circuit 574 is used to control y route circuit 560 to map the data among M divisions of Plane 1 (e.g., 5 divisions). N division loading circuit 576 is used to control y route circuit 560 to map the data among N divisions. In one embodiment, M is equal the total number of divisions for a plane (e.g., 5), and N is a subset of those divisions. In some embodiments, there can be multiple division loading circuits for each potential value of N. For example, there could be a circuit for loading three divisions, a circuit for loading four divisions, etc. To accommodate the embodiment of FIG. 7A, N=3, mux572 is used to switch between the control signals from M division loading circuit 574 and the control signals from N division loading circuit 576 and mux 580 is used to switch between the control signals from M division loading circuit 582 and the control signals from N division loading circuit 584. Skip circuit 556 is used to control data path circuit 554 and, N division loading circuit 576, N division loading circuit 584, the select line for multiplexor 580 and the select line for multiplexor 572. In one embodiment, the state machine 112 is connected to and controls M division loading circuit 570, M division loading circuit 574, N division loading circuit 576, y route circuit 558, y route circuit 560, registers 562, registers 564, sense amplifiers 566, sense amplifiers 568 and data path circuit 554.

Data to be programmed in Plane 0 (assuming Plane 0 is complete) is first received at I/O interface 552 and then provided to data path circuit 554 as a sequence of bytes (8 bits). Data path circuit 554 will aggregate 10 bytes of data into a parallel set of 80 bits and present that data to y route circuit 558. Based on control signals from M division loading circuit 582, y route circuit 558 will map the data as depicted in FIG. 5, for storage in register 562. Sense amplifiers 566 will store that data into Plane 0 from register 562.

Data to be stored in a complete memory storage unit of Plane 1 will be received at I/O interface 552 and presented to data path circuit 554. Ten bytes of data received by data path circuit 554 serially will be aggregated to one 80 bit parallel grouping of data presented to y route circuit 560. As the data is being programmed in a complete memory storage unit, mux 572 will select the control signals from M division loading circuit 574 for controlling y route circuit 560 to map the data, as per described above with respect to FIG. 5, for storage in register 564. Sense amplifiers 568 will program the data from registers 564 into Plane 1.

When data is to be stored in an incomplete memory storage unit (e.g. memory storage unit 352 of FIG. 7A) of Plane 1, the data is first received at I/O interface 552 and presented as a set of serial set of bytes to data path circuit 554. Data path circuit 554 will aggregate the bytes to a parallel set of 80 bits and provide those 80 bits to y route circuit 558 which will map the data, as per described above with respect to FIG. 5, based on the control signals from M division loading circuit 582, for storage in register 562. Once all the data to be programmed is loaded in register 562, the data is then transferred from register 562 to register 564. In some embodiments, the data is transferred after multiple sets of 80 bits are stored in register 562. In one embodiment, the data is transferred after 16K bits are stored. In other embodiments less than 16K bits are stored before transferring. The data is transferred from register 562 through y route circuit 558 back to FIFO 454 of data path circuit 554. The data is then forwarded to y route circuit 560 which re-maps the data based on control signals from N division loading circuit 576 such that the data aligns with the available divisions and does not align with unavailable divisions. For example, y route circuit 560 will then map the data as described above with respect to FIG. 9 so that data is provided in those portions of register 564 associated with DIV 0, DIV 1 and DIV 2, but not with portions of register 564 associated with DIV 3 and DIV 4. Sense amplifiers 568 will program that data into DIV 0, DIV 1 and DIV 2 (of memory storage unit 352) of Plane 1.

When data is to be stored in an incomplete memory storage unit of Plane 0, the data is first received at I/O interface 552 and presented as a set of serial set of bytes to data path circuit 554. Data path circuit 554 will aggregate the bytes to a parallel set of 80 bits and provide those 80 bits to y route circuit 560 which will map the data, as per described above with respect to FIG. 5, based on the control signals from M division loading circuit 574, for storage in register 564. Once all the data to be programmed is loaded in register 564, the data is then transferred from register 564 to register 562. The data is transferred from register 564 through y route circuit 560 back to FIFO 454 of data path circuit 554. The data is then forwarded to y route circuit 558 which rre-maps the data based on control signals from N division loading circuit 584 such that the data aligns with the available divisions and does not align with unavailable divisions. For example, y route circuit 558 will then re-map the data as described above with respect to FIG. 9 so that data is provided in those portions of register 562 associated with DIV 0, DIV 1 and DIV 2, but not with portions of register 562 associated with DIV 3 and DIV 4. Sense amplifiers 566 will program that data into DIV 0, DIV 1 and DIV 2 (of memory storage unit 352) of Plane 0.

In the embodiment of FIG. 13, portions of Y route circuit 558, FIFO 454, y route circuit 560, mux 572 and N division loading circuit 576 serve as the inter-plane re-mapping circuit that is connected to the two registers and configured to re-map the data from register 562 and store that re-mapped data in register 564 for programming into Plane 1.

In this embodiment the inter-plane re-mapping circuit reuses a portion of the standard data path circuit. Note that the standard data path circuit includes a high speed circuit and a low speed circuit. For example the high speed circuit includes I/O interface 552, read/write multiplexor 450 (see FIG. 10), SIPO circuit 452 and PISO circuit 456. The low speed circuit includes the output of SIPO 452, the input of PISO circuit 456, FIFO 454, y route circuit 558 and y route circuit 560. The inter-plane re-mapping circuit of FIG. 13 connects to the low speed circuit and does not connect the high speed circuit. That is, the inter-plane re-mapping circuit routes data from a first portion of the low speed circuit to a second portion of the low speed circuit, as well as providing control signals to the second portion of the low speed circuit, where the first portion of the low speed circuit is y route circuit 558 and the second portion of the low speed circuit is y route circuit 560.

Figure 14:
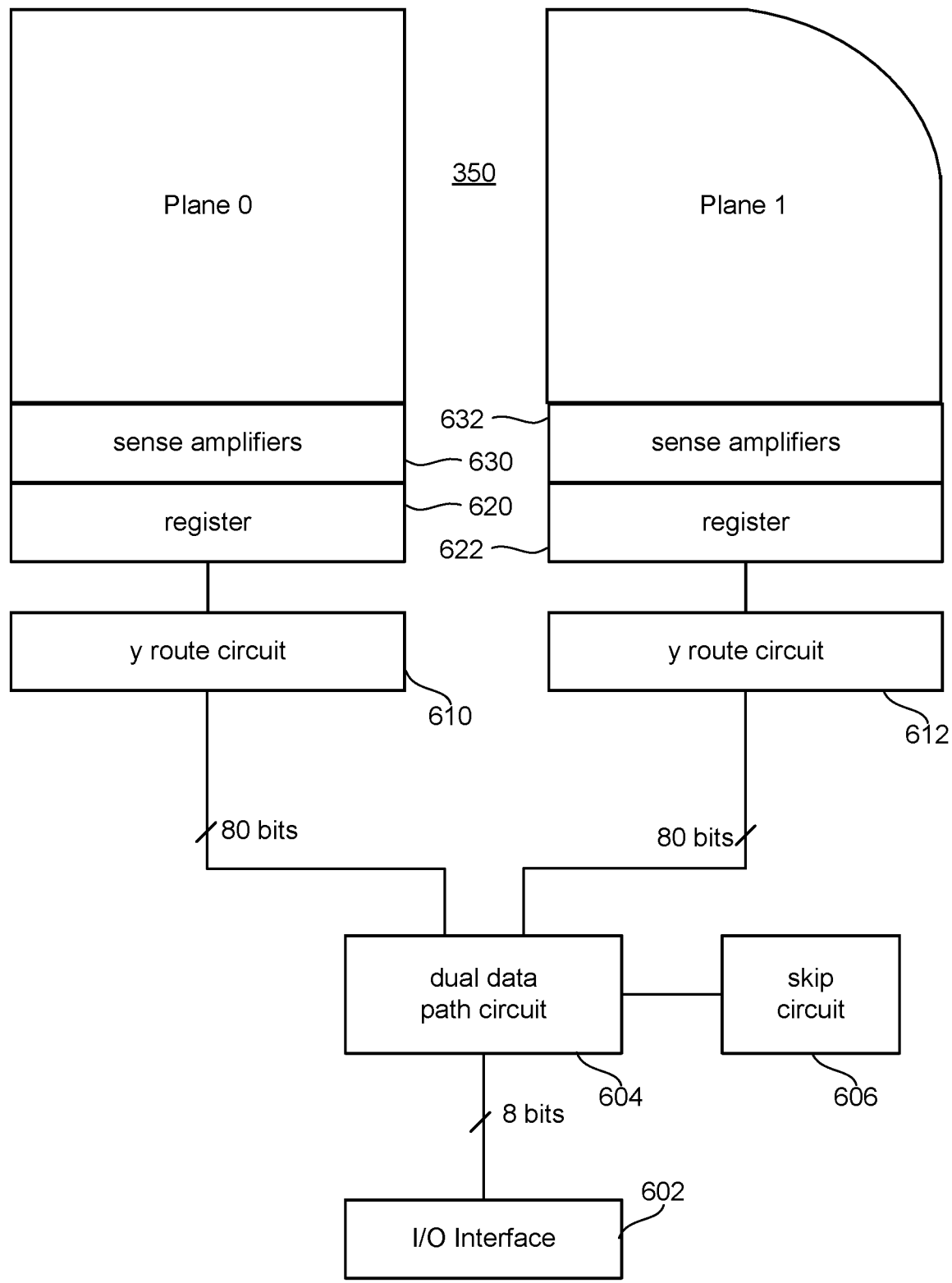
FIG. 14 depicts portions of one embodiment of a partial memory die.

FIG. 14 depicts portions of another embodiment of partial memory die 350, including Plane 0 and Plane 1, that includes an inter-plane re-mapping circuit for re-mapping data. In this example, Plane 1 is incomplete. However, in other examples, Plane 0 can be incomplete. FIG. 14 shows I/O interface 602, which corresponds to I/O interface 402. The output of I/O interface 602 is 8 bits that are provided to dual data path circuit 604, which is connected to skip circuit 606. In one embodiment, the skip circuit 606 is similar to skip circuit 406 of FIG. 8. Dual data path circuit 604 aggregates 10 bytes of data received at its high speed serial input and provides 80 bits of parallel data at its low speed output toy route circuit 610 and y route circuit 612. In one embodiment, y route circuit 610 is similar toy route circuit 410 of FIG. 8 and y route circuit 612 is similar to y route circuit 412 with FIG. 8. Y route circuit 610 is connected to register (or buffer) 620. Y route circuit 612 is connected to register (or buffer) 622. Sense amplifier 630 program the data from register 620 into Plane 0. Sense amplifier 632 programs the data from register 622 into Plane 1. In the embodiment of FIG. 14, dual data path circuit 604 performs a mapping and the re-mapping discussed above. In one embodiment, the state machine 112 is connected to and controls y route circuit 610, y route circuit 612, register 620, register 622, sense amplifiers 630, sense amplifiers 632, skip circuit 606, data path circuit 604 and I/O interface 602. Data can be re-mapped for programming into Plane 0 or Plan 1, depending on which plane is incomplete.

Figure 15:
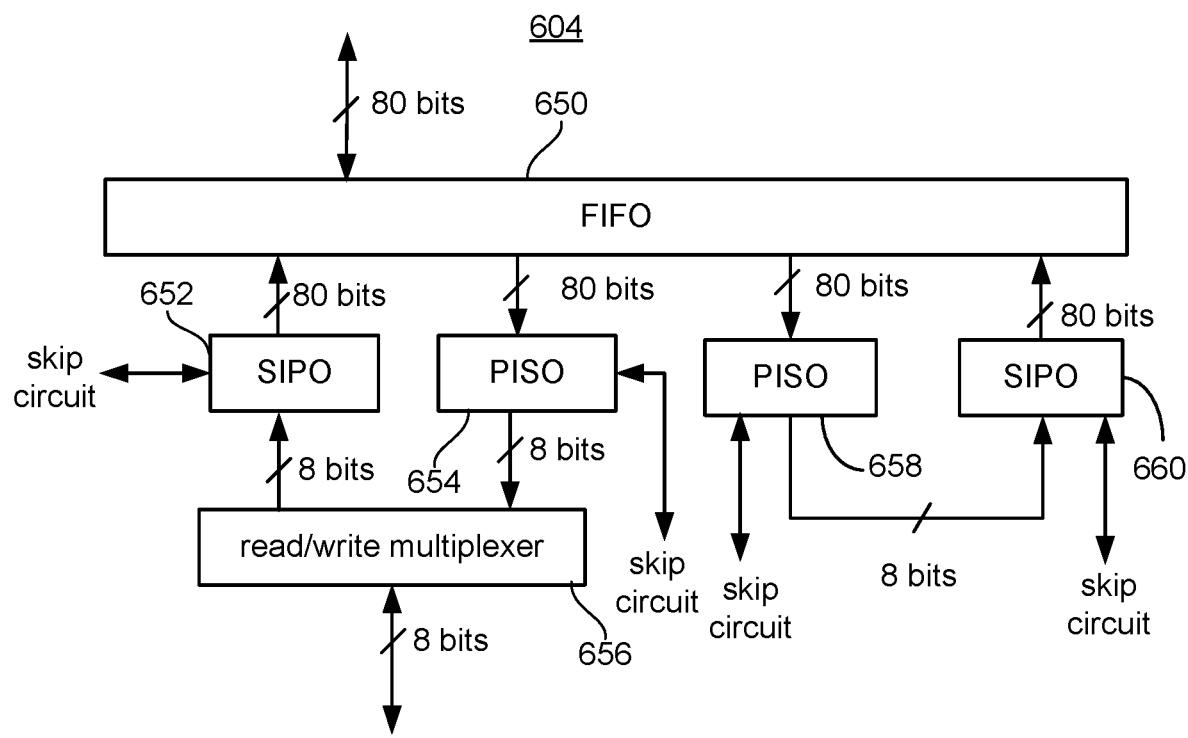
FIG. 15 depicts one embodiment of a data path circuit.

FIG. 15 depicts one embodiment of dual data path circuit 604. The circuit of FIG. 15 includes FIFO 650, SIPO 652, PISO 654, read/write multiplexor 656, PISO 658 and SIPO 660. Read/write multiplexor 656 is analogous to read/write multiplexor 450 of FIG. 10, and is used to interface with I/O interface 602 of FIG. 14. Read/write multiplexor 656 provides 8 bits of data to SIPO circuit 652, which operates similar to SIPO circuit 452 of FIG. 10 and FIG. 11. SIPO circuit 652 presents 80 bits (parallel data for 10 bytes) to FIFO 650, which is analogous to FIFO 454. FIFO 650 is in communication with y route circuit 610 and y route circuit 612 of FIG. 14. When receiving data that was read from Plane 0 or Plane 1, 80 bits of data are provided to PISO circuit 654 from FIFO 650. PISO circuit 654 is similar in structure and operation to PISO circuit 456 of FIG. 10 and FIG. 12. The output of PISO circuit 654 is a serial sets of 8 bits of data provided to read/write multiplexor 656. When data is being transferred from register 620 to register 622, and re-mapped as discussed above, the data is sent from register 620 to y route circuit 610 to FIFO 650 to PISO circuit 658. At PISO circuit 658 (which is connected to skip circuit 606) 80 bits of data is converted to a serial set of bytes of data and transferred serially (one byte at a time) to SIPO circuit 660, which converts the serial set of bytes to 10 parallel bytes of data for presentation to FIFO 650. PISO 658 has the same structure as depicted in FIG. 12. SIPO circuit 660 has the same structure as depicted in FIG. 11. Based on control signals to SIPO control 504 and PISO controls 524, data can be re-mapped among the 80 bits.

When writing data to Plane 0, in the embodiment of FIGS. 14 and 15, data is received at I/O interface 602 and transferred to dual data path circuit 604. Ten bytes received serially by dual data path circuit 604 are converted to a parallel set of 80 bits based on SIPO circuit 652. Those 80 bits are provided to y route circuit 610 which aligns the data among the five divisions for storage in register 620. Sense amplifier 630 programs Plane 0 based on the data in register 620. Sense amplifier 630 programs Plane 0 based on the data in register 620. Although data is presented to y route circuit 610 80 bits at a time, multiple sets of 80 bits can be provided to register 620 so that sense amplifier 630 can program multiple sets of 80 bits.

When writing to a complete memory storage unit of plane 1 (e.g. memory storage unit 366—FIG. 7A), data is first received at I/O interface 602 and presented to dual data path circuit 604. After 10 bytes are aggregated to an 80 bit set of data, that data is provided to y route circuit 612 for storage in register 622. Sense amplifier 632 program Plane 1 based on the data in register 622.

When programming data to an incomplete memory storage unit of Plane 1 (e.g. memory storage unit 352 with FIG. 7A), data is first received through the I/O interface 602 and then presented to dual data path circuit 604. The 80 bit output of dual data path circuit 604 is presented to Y route circuit 610 which distributes the data among the five divisions for storage in register 620. Multiple sets of 80 bits of data can be presented toy route circuit 610 for storage in register 620. After all the data to be programmed is stored in register 620, the data is transferred from register 620 to register 622 via the inter-plane re-mapping circuit. In the embodiment of FIG. 14, the inter-plane re-mapping circuit includes portions of y route circuit 610, y route circuit 612, FIFO 650, PISO circuit 658 and SIPO circuit 660. Therefore, the transfer of data from register 620 to register 622 includes the data first presented to y route circuit 610 and then to FIFO 650. From FIFO 650, the data is provided to PISO circuit 658 where it is converted to a serial set of 8 bits and transferred to SIPO circuit 660 which aggregates 10 bytes of data into a set of 80 bits for presentation back (remapped) to FIFO 650. From FIFO 650, it is provided to y route circuit 612 which will distribute the data to the appropriate divisions for Plane 1 so the data can be stored in register 622. Sense amplifiers 632 will program the data from register 622 into Plane 1. The data is stored in register 622 by y route circuit 612 such that the re-mapped data is aligned with the complete divisions and not aligned with the incomplete divisions. Thus, the re-mapping by PISO circuit 658 and SIPO circuit 660 along with the placement from y route circuit 612 store the data in register 622 in the manner as depicted in FIG. 9 (see storage of data in register 422 of FIG. 9).

As discussed above, the inter-plane re-mapping circuit for the embodiment of FIG. 14 reuses a portion of the dual data path circuit 604 as well as those portions of the data path that include y route circuit 610 and y route circuit 612. Additionally, the inter-plane re-mapping circuit of FIG. 14 connects to the low speed circuit but not the high speed circuit. For example, the high speed circuit includes I/O interface 602, SIPO circuit 652 and PISO circuit 654, while the low speed circuit includes FIFO 650, PISO 658, SIPO circuit 660, y route circuit 612 and y route circuit 610. Thus, the inter-plane re-mapping circuit re-maps data received from portions of the low speed circuit.

Figure 16:
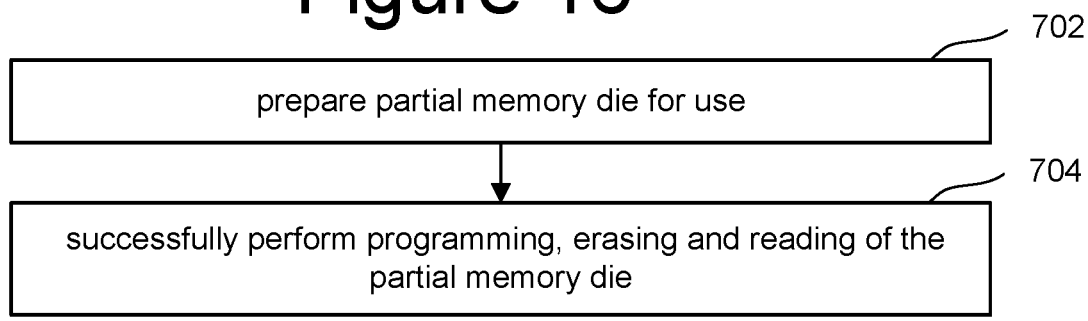
FIG. 16 is a flow chart describing one embodiment of a process for utilizing a partial memory die.

FIG. 16 is a flowchart describing one embodiment for the process for utilizing a partial memory die. For example, the process of FIG. 16 can be performed for partial memory die 350, including the embodiments of FIGS. 8, 13 and 14. In step 702 of FIG. 16, the partial die is prepared for use. In step 704, the partial memory die successfully performs programming/writing, erasing and reading. Some technologies refer to programming while others refer to writing.

Figure 17:
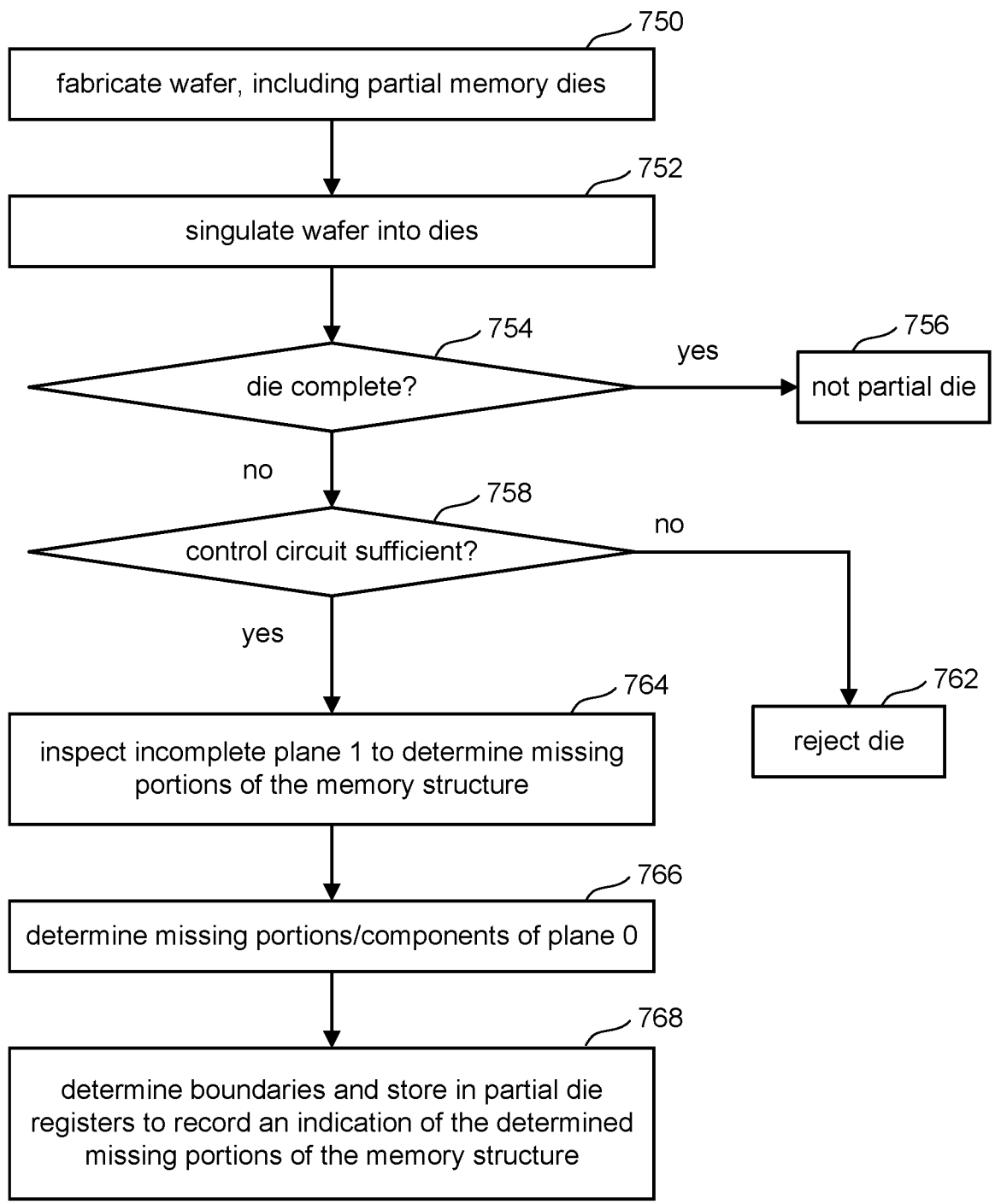
FIG. 17 is a flow chart describing one embodiment of a process for preparing a partial memory die for use.

FIG. 17 is a flowchart describing one embodiment of the process for preparing the partial memory die for use. That is, the process of FIG. 17 is one example implementation of step 702 of FIG. 16. In step 750, a wafer is fabricated. This includes fabricating the complete memory dies and the partial memory dies. In step 752, the wafer is singulated into separate dies including complete memory dies and partial memory dies. In step 754, it is determined whether each of the memory dies is complete. That is whether a portion of the memory die is missing because the memory die was at the edge of the wafer. If the memory die is complete, then it is not a partial memory die (step 756). If the memory die is not complete, then it is partial memory die and the process continues to step 758. Step 754 is performed for each of the memory dies that were singulated from the wafer in step 752. In step 758, it is determined whether the control circuit is sufficient. That is if portions of the control circuit are missing, the memory die may not be useful. For example, looking at FIG. 6, support circuits 351 are depicted as being complete. The control circuit needed to perform the programming and reading is a part of the support circuits 351 of FIG. 6. If sufficient amount of control circuits are not present, the die will be rejected in step 762. If there is sufficient portions of the control circuit on the die (e.g. in one embodiment the entire support circuits 351 including the entire control circuit must be present), then in step 764 Plane 1 is inspected to determine which portions of the plane are missing from the memory structure. In step 766, the system determines which portions/components of Plane 0 are missing. In step 768, the boundaries of the complete and incomplete portions of Plane 0 are determined and stored in the partial die registers (e.g., the registers of FIG. 7B) to record an indication of the determined missing portions of the memory structure. In one embodiment, step 754-768 are performed manually. In other embodiments, step 754-768 are performed automatically using robotics and computers. At the completion of the process of FIG. 17, the registers of FIG. 7B are populated. In one embodiment, upon activation of a memory system, the controller will read the registers of FIG. 7B and store that data in the local memory for the controller.

Figure 18:
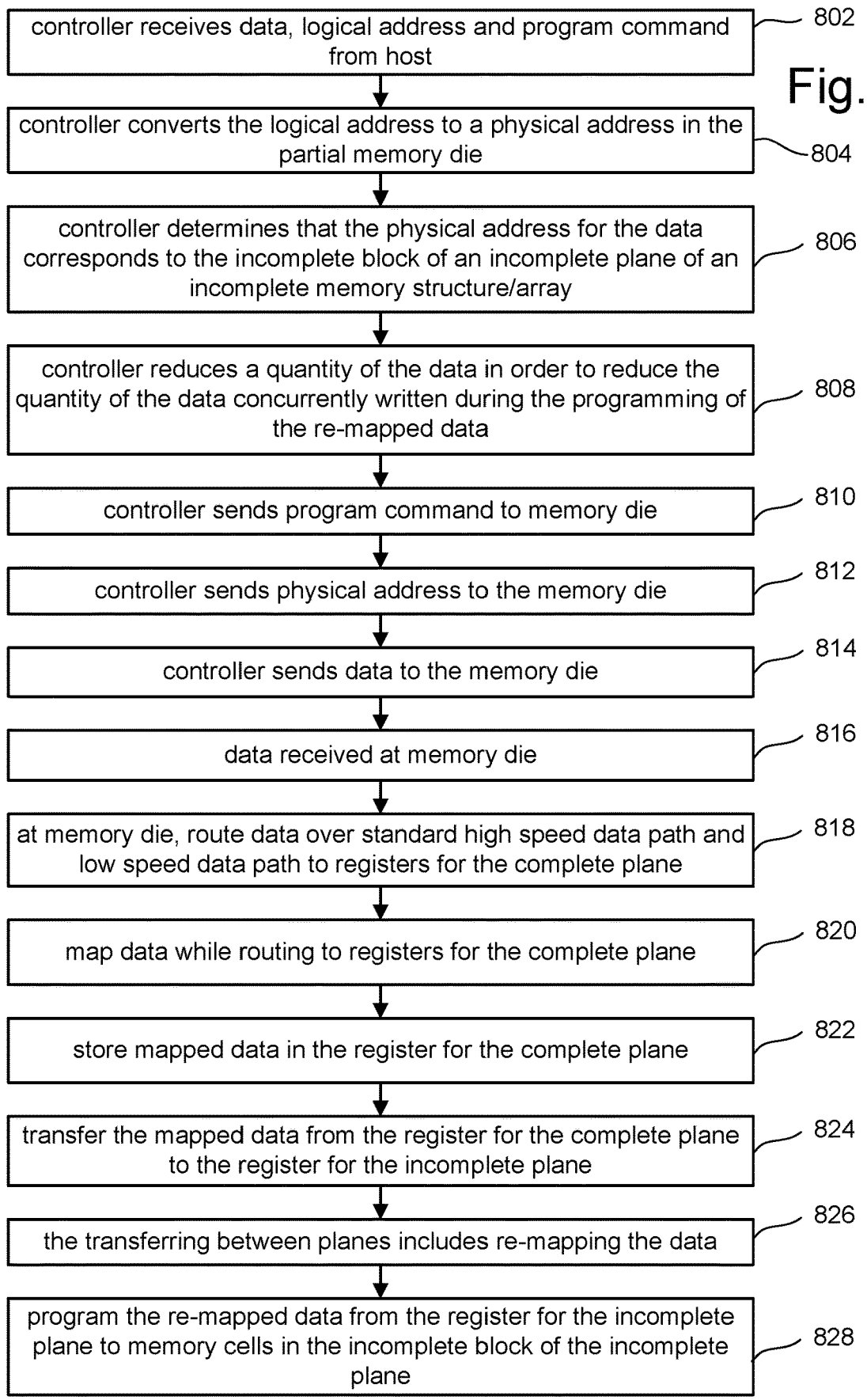
FIG. 18 is a flow chart describing one embodiment of a process for successfully programming a partial memory die.
Figure 19:
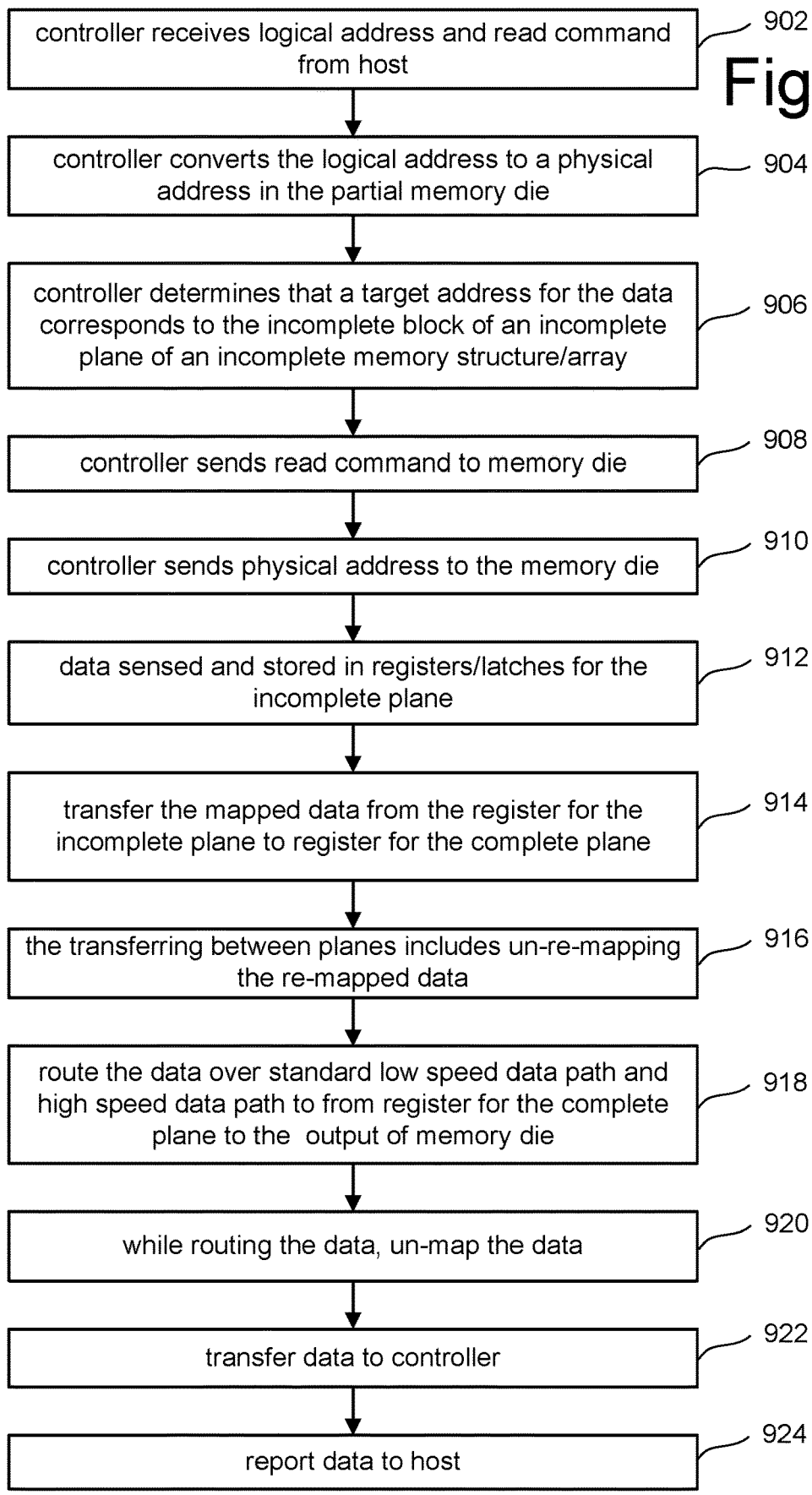
FIG. 19 is a flow chart describing one embodiment of a process for successfully reading a partial memory die.

FIG. 18 is a flowchart describing one embodiment of a process for successfully programming partial memory die. FIG. 19 is a flowchart describing one embodiment of a process for successfully reading a partial memory die. In one embodiment, erasing is performed for partial memory die in the same manner as it is performed for memory dies that are not partial memory dies. The processes of FIGS. 18 and 19 are example implementations of step 704 of FIG. 16. The processes of FIGS. 18 and 19 can be performed by partial memory die 350 of FIG. 6, using any of the embodiments of FIGS. 8, 13 and 14. Note that the steps of FIGS. 18 and 19 can be performed in the order as depicted in FIGS. 18 and 19 or in a different order.

In step 802 of FIG. 18, the controller (e.g. controller 122 of FIGS. 2 and/or 3) receives data, a logical address for programming that data and a program command from a host which is in communication with the controller. In this example, it is assumed that the data will be programmed in an incomplete memory storage unit of an incomplete plane of the non-volatile memory structure. Thus, step 802 includes the controller accesses and the data to be stored in the incomplete memory storage unit. In step 804, the controller converts the logical address to a physical address in the partial memory die. In step 806, the controller determines that the physical address for the data (converted in step 804) corresponds to an incomplete memory storage unit of an incomplete plane of an incomplete memory structure/array. In step 808, the controller reduces the quantity of the data to be stored in order to reduce the quantity of data concurrently written during the programming (as discussed above). That is, the controller recognizes that it will be programming to an incomplete memory storage unit, therefore the controller will adapt to this programming based on an indication that the memory die is a partial memory die and/or that the memory storage unit being programmed is an incomplete memory storage unit. In one embodiment, the controller will determine that the memory storage unit is an incomplete memory storage unit by checking the five registers for the plane (see registers of FIG. 7B). That is, each plane will include five registers as depicted in FIG. 7B. Based on the data in those registers, the controller can determine whether the memory storage unit is an incomplete memory storage unit. Since the incomplete memory storage unit has less available memory cells than a complete memory storage unit, the controller knows that it can store less data. Thus, the data to be programmed is either reduced from a larger set or verified to already be reduced to fit in the incomplete memory storage unit. For example, looking at FIGS. 7A and 9, if the controller is programming data to incomplete memory storage unit 352, then by the time the data gets to register 422 the data has to be stored in only ⅗ of register 422 corresponding to sections 422-0, 422-1 and 422-2. Therefore, when the controller first sends data to be stored in register 420, it can only send ⅗ of a page, which results in sections 420-0 through 420-4 of register 420 being only partially filled.

In another embodiment, the controller does not check for incomplete memory storage units or incomplete memory die. Instead, the memory die and its associated circuitry tracks whether or not the die is an incomplete die and/or includes incomplete memory storage units. Consequently in such embodiments the controller may send a full set of data for a complete memory storage unit. The incomplete memory die or a state machine that operates the incomplete memory die may re-map bytes of data originally addressed to the incomplete parts (data referred to herein as overflow data) of the incomplete memory storage units to other rows/word lines of the array which may be partially filled when the data is stored or to a designated section of the memory array for overflow data.

Some embodiments can have multiple memory die connected to a controller. A subset of the memory die may be complete memory die while a subset of the memory dies can be incomplete or partial memory dies. The controller is configured to select programming for partial memory dies to program a memory die that is a partial memory die based on indication that the memory die is a partial memory die, while the controller is configured to use programming for complete memory dies to program complete memory dies based on an indication there is no incomplete memory storage units within that complete memory die.

In step 810 of FIG. 18, the controller sends a program command to the memory die (e.g. the Toggle Mode interface discussed above). In step 812, the controller sends the physical address to the memory die (e.g., via the Toggle Mode interface discussed above). In step 814, the controller sends data to the memory die (e.g., via the Toggle Mode interface discussed above). In step 816, the data is received at the memory die. This is an example of the memory die accessing data to be stored in the incomplete memory storage unit of an incomplete plane of a non-volatile memory structure (partial memory die).

At the memory die, data is routed over the standard high speed data path and low speed data path to registers for the complete plane. For example, the data is received at I/O interface 402, 552 or 602 and transferred to the appropriate register for Plane 0 (registers 420, 562 or 620) via the appropriate data path circuit and y route circuit. While routing the data to the register for the complete plane, the data is mapped as discussed above (step 820). In step 822, the mapped data is stored in the register for the complete plane. Step 824 includes transferring the mapped data from the register for the complete plane to the register for the incomplete plane. In step 826, while transferring the data from the register for the complete plane to the register for the incomplete plane, the data is re-mapped. For example, looking at FIG. 8, step 826 includes transferring the data from register 420 to register 422 via inter-plane re-mapping circuit 440. Looking at FIG. 13, step 824 includes transferring data from register 562 to register 564 via y route circuit 558, data pass circuit 564 and y route circuit 560. Looking at FIG. 14, step 824 includes transferring data from register 620 to register 622 via y route circuit 610, FIFO 650, PISO circuit 658, SIPO circuit 660, and y route circuit 612. The transferring between planes includes re-mapping the data (step 826). As discussed above, the incomplete memory storage unit has complete portions and incomplete portions. The transferring of mapped data includes re-mapping the data to align with the complete portions of the incomplete memory storage unit and not align with the incomplete portions of the incomplete memory storage unit, as depicted in FIG. 9 and discussed above with respect to the embodiments of FIGS. 8, 13 and 14. In step 828 of FIG. 18, the re-mapped data is programmed from the register for the incomplete plane to memory cells in the incomplete memory storage unit of the incomplete plane.

FIG. 19 is a flowchart describing one embodiment of the process for successfully reading partial memory die 350. In step 902, the controller receives a logical address and a read command from the host. In step 904, the controller converts the logical address to a physical address in the partial memory die. In step 906, the controller determines that the target address for the data corresponds to an incomplete memory storage unit of incomplete plane of incomplete memory structure/array. This determination is based on looking at the five registers (see FIG. 7B) for the memory storage unit associated with the physical address that was converted in step 904. In step 908, the controller sends a read command to memory die 108 (e.g., via the Toggle Mode interface discussed above). In step 910, the controller sends a physical address of the target memory storage unit to the memory die (e.g. via the Toggle Mode interface discussed above).

In step 912, state machine 112 will cause the addressed data to be sensed and stored in the appropriate register. For example, data from an incomplete memory storage unit in Plane 1 will be stored in register 422, register 564 or register 622. In step 914, the data (which is mapped data), will be transferred from the register for Plane 1 (the incomplete plane) to the register for the complete plane (e.g. Plane 0). That is, the data will be transferred from either register 422, register 564 or register 622 to register 420, register 562 or register 620 via the appropriate inter-plane re-mapping circuit. While transferring that data between registers (and between planes) the data will be unre-mapped (e.g., reverse the re-mapping of step 826). In step 918, the data is routed over the low speed data path and the high speed data path from the register for the complete plane to the output of the memory die. For example, data stored in register 420 (see FIG. 8) will be transferred to I/O interface 402 via y route circuit 410 and data path circuit 404. In the embodiment of FIG. 13, data in register 562 will be transferred to I/O interface 552 via y route circuit 558 and data path circuit 554. In the embodiment of FIG. 14, data in register 620 will be transferred to I/O interface 602 via y route circuit 610 and dual data path circuit 604 (FIFO 650, PISO circuit 654 and read/write multiplexor 656). While routing the data from the register to the I/O interface, the data will be unmapped (the reverse of what is depicted in FIG. 5 or the reverse of what is depicted in the bottom of FIG. 9). The unmapped data is then transferred to the controller in step 922. That data is reported to the host from the controller in step 924.

Some of the above-described examples are provided for Plane 1 being incomplete. However, it is possible for Plane 0 to be incomplete and the memory die can include the inter-plane re-mapping circuit for compensating for an incomplete Plane 0. In some embodiments when both planes are damaged, the inter-plane re-mapping circuit can be used for re-mapping data for both planes. The inter-plane re-mapping circuit and related technology described above can also be used when a die is cracked, rather than missing a portion.

In some embodiments, the same design is used for all memory dies made on a common wafer. Therefore, the technology for successfully programming, erasing and reading partial memory die (including the inter-plane re-mapping circuit) are included on all memory die fabricated on a common wafer. Therefore, the memory dies are configured to program/write/erase/read each of the memory storage units, including if the memory storage units are complete memory storage units or incomplete memory storage units. As such, the support circuit described above is configured to write data to, and read data from, each memory storage unit regardless of whether the memory storage unit is a complete memory storage unit or an incomplete memory storage unit. However, the support circuit is adapted to change how it programs or reads, as discussed above. Similarly, the support circuit described above is configured to write data to, and read data from, each memory storage unit regardless of whether the memory storage unit is a complete memory storage unit or an incomplete memory storage unit.

The above-described technology allows for the use of partial dies, thereby increasing yield of the semiconductor manufacturing process.

One embodiment includes an apparatus comprising a partial memory die configured to successfully perform programming, erasing and reading.

One embodiment includes an apparatus comprising a non-volatile memory structure including a memory storage unit and a support circuit connected to the non-volatile memory structure. The support circuit configured to write data to, and read data from, the memory storage unit if the memory storage unit is an incomplete memory storage unit.

In one example implementation, the support circuits writes data to the memory storage unit in a first manner if the first memory storage unit is a complete memory storage unit and writes data to the memory storage unit in a second manner if the first memory storage unit is an incomplete memory storage unit.

One embodiment includes an apparatus comprising a memory structure comprising a plurality of memory storage units of non-volatile memory cells and a control circuit connected to the memory structure. At least one of the memory storage units is a physically partial memory storage unit. The control circuit is configured to successfully program the physically partial memory storage unit.

One embodiment includes an apparatus comprising a partial memory die comprising a control circuit configured to program data to the partial memory die and read data from the partial memory die.

One embodiment includes an apparatus comprising a memory structure comprising a first plane of non-volatile memory cells and a second plane of non-volatile memory cells. The second plane of non-volatile memory cells is incomplete. The apparatus further comprises a first buffer connected to the first plane and a second buffer connected to the second plane, and an inter-plane re-mapping circuit connected to the first buffer and the second buffer. The inter-plane re-mapping circuit is configured to re-map data from the first buffer and store the re-mapped data in the second buffer for programming into the second plane.

One embodiment includes a method comprising: accessing data to be stored in an incomplete memory storage unit of an incomplete plane of a non-volatile memory structure; routing the data to a register for a complete plane of the non-volatile memory structure, the complete plane is different than the incomplete plane, the routing the data includes mapping the data and storing the mapped data in the register for the complete plane; transferring the mapped data from the register for the complete plane to a register for the incomplete plane, the transferring includes re-mapping the data; and programming the re-mapped data from the register for the incomplete plane to memory cells in the incomplete memory storage unit of the incomplete plane.

One embodiment includes an apparatus comprising a partial memory die comprising means for successfully programming data into the partial memory die by mapping the data to align with all portions of memory storage units and subsequently re-mapping the mapped data to align the re-mapped data with only a portion of an incomplete memory storage unit.

In one embodiment, the means for successfully programming data into the partial memory die performs the process of FIG. 18 using the structures depicted in FIG. 8, 13 or 14, all of which are embodiments of partial memory die 350 of FIG. 6 (or FIG. 6A), which is itself an embodiment of the memory system of FIG. 2 or FIG. 3. State machine 112 uses the sense blocks and decoders to perform programming. The data is routed to the appropriate registers, mapped, and then re-mapped while being transferred using the structure and processes described above.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
    a memory structure comprising a first plane of non-volatile memory cells and a second plane of non-volatile memory cells;
    storage configured to store an indication of where the second plane of non-volatile memory cells is missing components, wherein the missing components are elements not printed at the time of fabrication of the memory structure;
    a first buffer connected to the first plane;
    a second buffer connected to the second plane, the second buffer is different than the first buffer; and
    an inter-plane re-mapping circuit connected to the first buffer and the second buffer, the inter-plane re-mapping circuit is configured to re-map bits of data from the first buffer based on the indication of where the second plane of non-volatile memory cells is missing components by changing alignment of the bits of the data and reordering the bits of the data such that the remapped data is aligned with portions of the second plane that are complete and not aligned with a portion of the second plane that is missing, the inter-plane re-mapping circuit is configured to store the re-mapped data in the second buffer for programming into the second plane.

2. The apparatus of claim 1, wherein:
    the second plane is divided into a plurality divisions; and
    the storage comprises a set of registers including one register per division that indicates a first usable memory storage unit that is in a respective division.

3. The apparatus of claim 1, further comprising:
a programming circuit configured to program the first plane from the first buffer and program the second plane from the second buffer.

4. The apparatus of claim 1, further comprising:
an input interface; and
a data path circuit connected to the input interface, the first buffer and the second buffer, the data path circuit is configured to map data received at the input interface and route the mapped data to one of the first buffer and the second buffer.

5. The apparatus of claim 4, wherein:
the data path circuit includes a high speed circuit and a low speed circuit; and
the inter-plane re-mapping circuit connects to the low speed circuit and does not connect to the high speed circuit.

6. The apparatus of claim 1, wherein:
the inter-plane re-mapping circuit is configured to reverse the re-mapping of data.

7. The apparatus of claim 1, further comprising:
a control circuit, the control circuit is configured to read the storage and configure the inter-plane re-mapping circuit to align the re-mapped data with portions of the second plane that are complete and not align the re-mapped data with portions of the second plane that are incomplete.

8. A method, comprising:
accessing data addressed to be stored in an incomplete plane of a non-volatile memory structure and routing the accessed data to a register for a complete plane of the non-volatile memory structure, the complete plane is different than the incomplete plane, the incomplete plane is missing components that were not printed at the time of fabrication of the non-volatile memory structure, the routing the data includes arranging the data in a first sequence and storing the data in the first sequence in the register for the complete plane;
after the routing, transferring the data from the register for the complete plane to a register for the incomplete plane, the transferring includes rearranging the data into a second sequence that is different than the first sequence without losing data such that the data is aligned with portions of the incomplete plane that are complete and not aligned with portions of the incomplete plane that are missing; and
programming the data from the register for the incomplete plane to memory cells in the incomplete plane.

9. The method of claim 8, further comprising:
accessing a stored indication of portions of the incomplete plane that are incomplete; and
determining that the data is addressed for a block that is incomplete based on the stored indication.

10. The method of claim 9, wherein:
the programming the data includes programming the data into the complete portions of the incomplete memory storage unit and not programming the data into the incomplete portions of the incomplete memory storage unit.

11. The method of claim 8, further comprising:
determining that a target address for the data corresponds to the incomplete memory storage unit; and
reducing a quantity of the data routed to the register for the complete plane in order to reduce the quantity of the data concurrently written during the programming of the data.

12. The method of claim 8, further comprising:
determining missing portions of the incomplete memory plane; and
recording an indication of the determined missing portions of the incomplete memory plane, the rearranging is based on the indication.

13. The method of claim 12, further comprising:
a controller accessing the indication and sending a reduced amount of data to the non-volatile memory structure for a programming process based on the indication.

14. The method of claim 12, wherein:
the indication of the determined missing portions of the memory structure is stored in registers on a partial memory die that comprises the non-volatile memory structure.

15. The method of claim 8, further comprising:
receiving data to be programmed;
receiving a logical address for the received data to be programmed; and
converting the logical address to a physical address in the non-volatile memory structure, the programming includes storing the data at the physical address.

16. An apparatus, comprising:
a partial memory die that is missing components the partial memory die is designed to have including missing memory cells and a portion of a bit line that were not printed at the time of fabrication of the partial memory die, the partial memory die comprising:
means for storing an indication of a portion on an incomplete memory storage unit of the partial memory die that is missing; and
means for successfully programming data into the partial memory die by mapping the data to align with all portions of memory storage units and subsequently re-mapping the mapped data to align the re-mapped data with only a portion of the incomplete memory storage unit and not align the re-mapped data with the portion of the incomplete memory storage unit that is missing.

17. The apparatus of claim 16, wherein:
the means for successfully programming comprises means for mapping data, storing the mapped data for a first plane of the partial memory die, changing the alignment of and reordering the mapped data and programming the reordered data with the changed alignment into a second plane of the partial memory; and
the memory storage units are pages of data.

18. The apparatus of claim 1, further:
a controller on a controller die;
the memory structure, the storage, the first buffer, the second buffer and the inter-plane re-mapping circuit comprise a memory die, the memory die is different than the controller die, the memory die is connected to the controller.

* * * * *